United States Patent
Hasegawa

(10) Patent No.: US 9,490,772 B2
(45) Date of Patent: Nov. 8, 2016

(54) CERAMIC PACKAGE, ELECTRONIC COMPONENT DEVICE, AND METHOD FOR MANUFACTURING THE ELECTRONIC COMPONENT DEVICE

(71) Applicant: NGK SPARK PLUG CO., LTD., Nagoya-shi, Aichi (JP)

(72) Inventor: Masami Hasegawa, Konan (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 15/060,747

(22) Filed: Mar. 4, 2016

(65) Prior Publication Data
US 2016/0268995 A1 Sep. 15, 2016

(30) Foreign Application Priority Data
Mar. 11, 2015 (JP) .................................. 2015-047797

(51) Int. Cl.
| | |
|---|---|
| *H01L 23/10* | (2006.01) |
| *H03H 9/05* | (2006.01) |
| *H05K 1/03* | (2006.01) |
| *H05K 1/02* | (2006.01) |
| *H05K 3/10* | (2006.01) |
| *H03B 5/32* | (2006.01) |

(52) U.S. Cl.
CPC .................. *H03H 9/05* (2013.01); *H03B 5/32* (2013.01); *H05K 1/0296* (2013.01); *H05K 1/0306* (2013.01); *H05K 3/10* (2013.01); *H05K 2201/0999* (2013.01); *H05K 2201/10371* (2013.01)

(58) Field of Classification Search
CPC ............... H05K 1/183; H05K 1/0306; H05K 2201/09036; H05K 2201/10075; H01L 23/10; H01L 23/041; H01L 23/053; H01L 21/50; H01L 2224/16225; H01L 2224/32225; H01L 2224/73204; H01L 2924/00; H03H 9/1014
See application file for complete search history.

(56) References Cited

U.S. PATENT DOCUMENTS

| | | | | |
|---|---|---|---|---|
| 3,586,917 A | * | 6/1971 | Oates ...................... | H01L 23/42 174/16.3 |
| 4,709,122 A | * | 11/1987 | Samuels ................. | H01L 21/50 174/50.5 |
| 2004/0257779 A1 | * | 12/2004 | Itoh ........................ | H01L 23/057 361/752 |
| 2006/0187608 A1 | * | 8/2006 | Stark ....................... | C03C 27/08 361/202 |
| 2007/0107493 A1 | * | 5/2007 | Katsuda ............. | G01N 33/0009 73/23.31 |
| 2010/0270669 A1 | * | 10/2010 | Medeiros, III ........ | H01L 23/055 257/692 |
| 2012/0061133 A1 | * | 3/2012 | Masuda ................ | H01L 23/057 174/261 |

(Continued)

FOREIGN PATENT DOCUMENTS

JP 2013-243232 A 12/2013

*Primary Examiner* — Hoa C Nguyen
(74) *Attorney, Agent, or Firm* — Stites & Harbison, PLLC; Jeffrey A. Haeberlin; James R. Hayne

(57) ABSTRACT

A ceramic package includes a package body made of a ceramic and including a pair of surfaces, and side surfaces, disposed between four sides of one of the surfaces and four sides of the other surface; a cavity that has an opening in the surface of the package body; a metalizing layer disposed over the surface of the package body surrounding the opening of the cavity; and a metal frame joined to an upper surface of the metalizing layer with a brazing filler metal layer interposed therebetween. The surface surrounding the opening of the cavity includes pairs of opposing side portions and each side portion of at least one of the pairs has a recessed portion in a middle portion of the side portion and a pair of flat portions on respective sides of the recessed portion.

11 Claims, 17 Drawing Sheets

(56) References Cited

U.S. PATENT DOCUMENTS

| | | | |
|---|---|---|---|
| 2014/0084752 A1* | 3/2014 | Miyasaka | G01C 19/5628 310/348 |
| 2014/0174803 A1* | 6/2014 | Suzuki | H05K 1/0306 174/258 |
| 2014/0196935 A1* | 7/2014 | Tojo | H01L 23/10 174/255 |
| 2014/0269220 A1* | 9/2014 | Tamura | H03H 9/21 368/47 |
| 2014/0319982 A1* | 10/2014 | Yamamoto | H05K 1/183 312/223.1 |

* cited by examiner

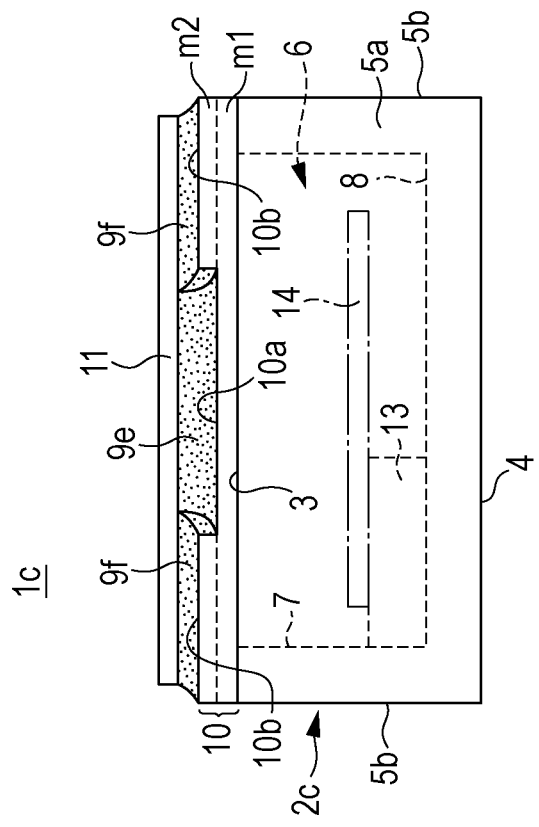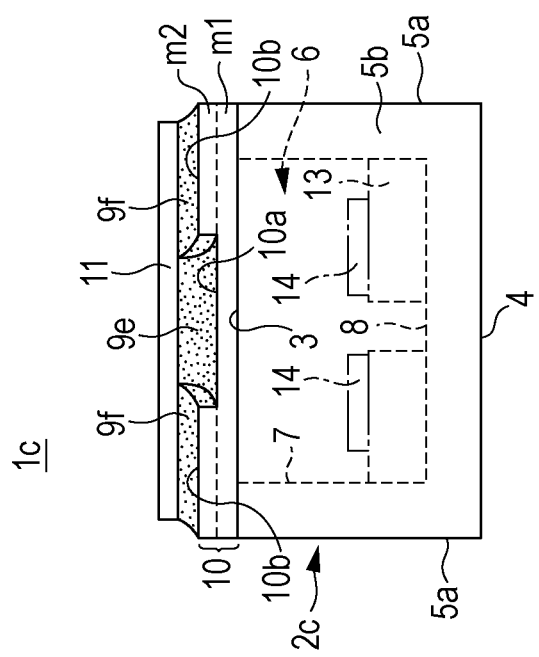

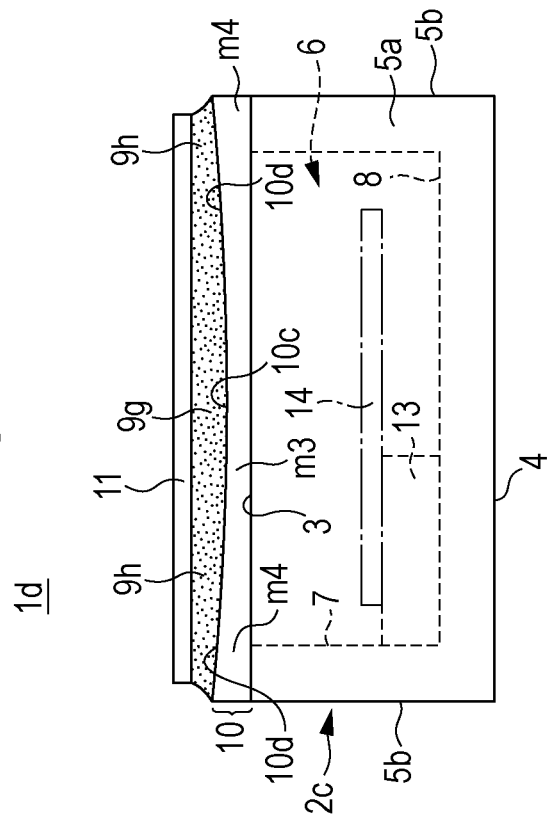
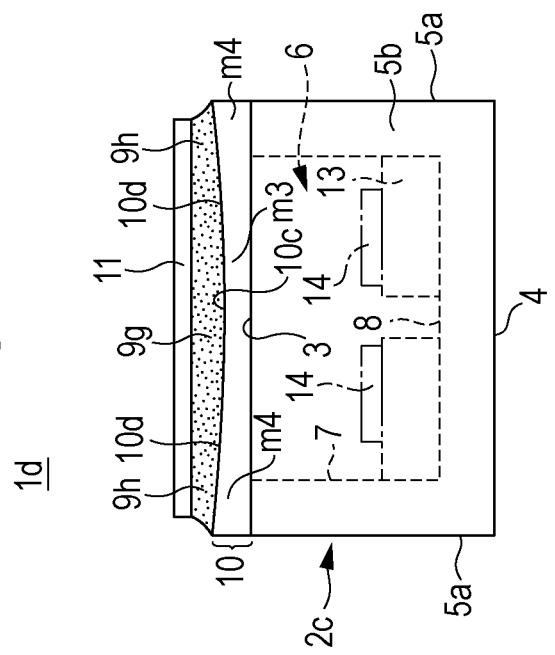

FIG. 17A
FIG. 17B
FIG. 17C
FIG. 17D
FIG. 17E
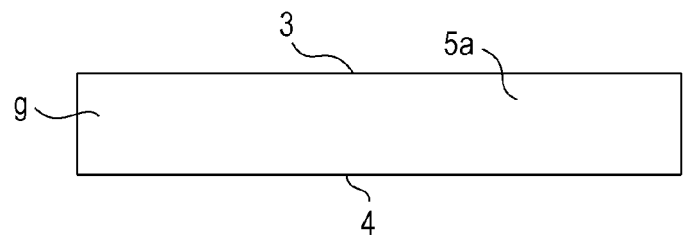
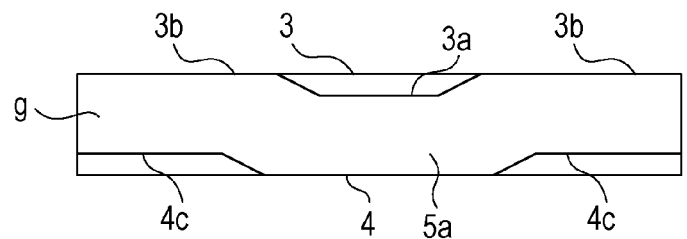
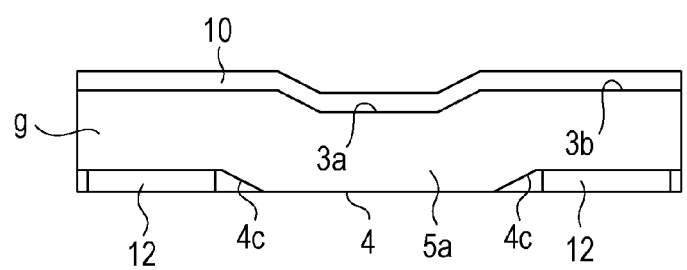
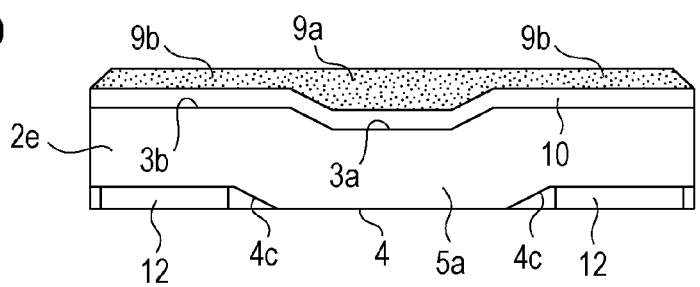
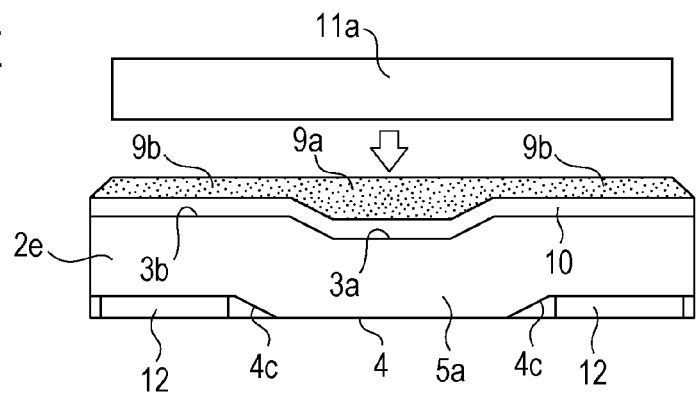

CERAMIC PACKAGE, ELECTRONIC COMPONENT DEVICE, AND METHOD FOR MANUFACTURING THE ELECTRONIC COMPONENT DEVICE

CROSS REFERENCE TO RELATED APPLICATION

The present application claims priority to Japanese Patent Application No. 2015-047797, which was filed on Mar. 11, 2015, the disclosure of which is herein incorporated by reference in its entirety.

BACKGROUND OF THE INVENTION

Field of the Invention

The present invention relates to a ceramic package that includes a box-shaped ceramic package body having surfaces in at least one of which a cavity is open, an electronic component device including the ceramic package, and a method for manufacturing the electronic component device.

Description of the Related Art

A ceramic package has been developed in which, for example, a rectangular parallelepiped ceramic package body has a surface having a rectangular frame shape when viewed in a plan so as to surround a cavity, a metalizing layer is disposed on the surface, and a metal frame is brazed onto the metalizing layer with a brazing filler metal layer interposed therebetween (see, for example, Patent Document 1).

A metal lid is joined onto the metal frame of the ceramic package by seam welding.

RELATED ART DOCUMENTS

Patent Document 1 is Japanese Unexamined Patent Application Publication No. 2013-243232 (pages 1 to 11 and FIGS. 1 to 13).

BRIEF SUMMARY OF THE INVENTION

While a rectangular metal lid is being joined by seam welding onto the upper surface of the metal frame, having a rectangular frame shape when viewed in a plan, the following phenomena occur. When a pair of roller electrodes are moved along a pair of opposing sides of the metal lid while being rolled, welding heat transmitted from the vicinities of the individual roller electrodes coincides around the middle portion between the pair of roller electrodes. Concurrently with the heat transmission, the electric resistance to the welding current flowing between the pair of roller electrodes also rises to the highest degree around the middle portion between the pair of roller electrodes. Thus, the brazing filler metal around the middle portion of each side of the metal lid interposed between the pair of roller electrodes or around a portion immediately under the middle portion melts partially, whereby reliable airtightness of the cavity and an electronic component installed in the cavity is impaired in some cases.

The present invention aims to provide the following ceramic package that has overcome the problems described in the background, an electronic component device including the package, and a method for manufacturing the electronic component device. The ceramic package has highly reliable airtightness such that, while a rectangular metal lid is being seam-welded to the upper surface of a metal frame bonded onto a metalizing layer, surrounding an opening of the cavity of a box-shaped package body, with a brazing filler metal interposed therebetween to seal the opening, the metal lid or the brazing filler metal is not partially melted by heat transmitted from the pair of roller electrodes or electric resistance heat, the metal frame having a rectangular frame shape when viewed in a plan, the opening being open in at least one of opposing surfaces of the package body.

The present invention was made to solve the above-described problems on the basis of an idea of feeding a larger amount (volume) of brazing filler metal to a middle portion of each side of a metalizing layer, disposed on the surface of a box-shaped or plate-shaped package body and having a rectangular frame shape when viewed in a plan, and to a middle portion of a metal frame, having a similar shape when viewed in a plan, and feeding a smaller amount of brazing filler metal to both end portions of each side of the metalizing layer and to both end portions of the metal frame, the brazing filler metal being interposed between the metalizing layer and the metal frame for joining the metal frame onto the upper surface of the metalizing layer.

Specifically, a first ceramic package according to the present invention includes a package body made of a ceramic and including a pair of surfaces (i.e., a top surface and a bottom surface), each having a rectangular outline when viewed in a plan, and side surfaces disposed between four sides (edges) of one of the surfaces (the top surface) and four sides (edges) of the other surface (the bottom surface), the package body defining a cavity that has an opening in at least one of the surfaces (i.e., at least one of the top surface and the bottom surface) of the package body, the opening rectangular when viewed in a plan; a metalizing layer disposed over the at least one surface (i.e., the at least one of the top surface and the bottom surface) of the package body surrounding the opening of the cavity and having a rectangular frame shape when viewed in a plan; and a metal frame joined to an upper surface of the metalizing layer with a brazing filler metal layer interposed therebetween. The at least one surface of the package body surrounding the opening of the cavity includes pairs of opposing side portions and each side portion of at least one of the pairs includes a recessed portion in a middle portion of the side portion and a pair of flat portions on respective sides of the recessed portion. In other words, the at least one of the top surface and the bottom surface of the package body includes pairs of opposing side portions surrounding the opening of the cavity and for at least one of the pairs of opposing side portions, each side portion of the pair includes a recessed portion in a middle portion of the side portion and a flat portion at each end of the recessed portion.

Here, in the first ceramic package, the at least one surface of the package body surrounding the opening of the cavity includes pairs of opposing side portions and each side portion of at least one of the pairs includes a recessed portion in a middle portion of the side portion and a pair of flat portions on respective sides of the recessed portion. At each side portion of the surface of the package body, a relatively large amount of brazing filler metal is fed to a middle portion at which the recessed portion is located and a relatively small amount of brazing filler metal is fed to the pair of flat portions. Thus, the first ceramic package is capable of achieving the following effects (1) to (4):

(1) even if welding heat that occurs when the metal lid is seam-welded to the upper surface of the metal frame concentrates on a middle portion of each side portion, a large part of such welding heat is allowed to be dispersed by the brazing filler metal and the brazing filler metal itself is prevented from being unintendedly remelted;

(2) while the metal lid is being seam-welded to the upper surface of the metal frame, even when welding current that flows across a pair of roller electrodes that roll along a pair of opposing side portions of the metal lid generates heat due to an electric resistance in the brazing filler metal in the middle portion of each side portion of the surface of the package body, the amount of heat can be reduced by a relatively large amount of brazing filler metal;

(3) even when contraction stress that occurs in accordance with heat shrinkage of the metal lid after the metal lid is seam-welded to the upper surface of the metal frame is concentrated on the middle portion of each side portion of the metal lid, such stress is successfully absorbed and dispersed by a portion of brazing filler metal disposed around the middle portion of each side portion of the surface of the package body; and (4) a ceramic package having highly reliable airtightness in which the metal lid or the brazing filler metal is not partially melted during seam welding can thus be provided.

Examples of the above-described ceramic include a high-temperature fired ceramic such as alumina and a low-temperature fired ceramic such as a glass-ceramic.

The rectangular shape and the rectangular frame shape include a rectangle and a square.

The side portion described above indicates either one of the sides of the surface having a rectangular frame shape.

When the surface of the package body has a rectangular frame shape, at least one pair of opposing side portions represents a pair of short sides. When the surface of the package body has a square frame shape, at least one pair of opposing side portions represents two pairs of opposing side portions, that is, all the four sides.

A pair of surfaces of the package body is a relative name and the surfaces are also referred to as, for example, a surface and an undersurface.

The bottom surface of the recessed portion of each side portion of the surface of the package body or the metalizing layer is located lower than the pair of flat portions of the side portion by at least 5 µm.

The flat portions of each side portion include, besides flat surfaces, tapered surfaces or curved surfaces that are gradually inclined in the longitudinal direction of the side portion.

Each flat portion of each side portion represents at least a corner portion, which is angular when viewed in a plan and at which the outer side surfaces and the inner side surfaces of two sides of the package body adjacent to each other when viewed in a plan cross one another, or an area having a thickness between the outer side surface and the inner side surface of each side portion and extending along the side portion from the corner portion. At each side portion, the area interposed between the pair of flat portions is the recessed portion.

One or more pairs of electrodes are disposed on the bottom surface of the cavity so as to allow electronic components such as quartz oscillators to be mounted on the electrodes.

In the case where the ceramic is a high-temperature fired ceramic, the metalizing layer is mainly made of, for example, tungsten (W) or molybdenum (Mo). In the case where the ceramic is a low-temperature fired ceramic, the metalizing layer is mainly made of, for example, copper (Cu) or silver (Ag).

In addition, the metal frame (metal ring) is made of, for example, alloy 42 (42% Ni, Fe), Kovar (Fe, 29% Ni, 17% Co), alloy 194 (Cu, 2.3% Fe, 0.03% P), austenitic stainless steels, or other stainless steels.

A second ceramic package according to the invention includes a package body made of a ceramic and including a pair of surfaces (i.e., a top surface and a bottom surface), each having a rectangular outline when viewed in a plan, and side surfaces disposed between four sides (edges) of one of the surfaces (the top surface) and four sides (edges) of the other surface (the bottom surface), the package body defining a cavity that has an opening in at least one of the surfaces (i.e., at least one of the top surface and the bottom surface) of the package body, the opening rectangular when viewed in a plan; a metalizing layer disposed over the at least one surface (i.e., the at least one of the top surface and the bottom surface) of the package body, the metalizing layer surrounding the opening of the cavity and having a rectangular frame shape when viewed in a plan; and a metal frame joined to an upper surface of the metalizing layer with a brazing filler metal layer interposed therebetween. The metalizing layer includes pairs of opposing side portions and each side portion of at least one of the pairs includes a recessed portion in a middle portion of the side portion and a pair of flat portions on respective sides of the recessed portion. In other words, the metalizing layer includes pairs of opposing side portions and for at least one of the pairs of opposing side portions, each side portion of the pair includes a recessed portion in a middle portion of the side portion and a flat portion at each end of the recessed portion.

Here, in the second ceramic package, the metalizing layer includes pairs of opposing side portions and each side portion of at least one of the pairs includes a recessed portion in a middle portion of the side portion and a pair of flat portions on respective sides of the recessed portion. At each side portion of metalizing layer, a relatively large amount of brazing filler metal is fed to a middle portion at which the recessed portion is located and a relatively small amount of brazing filler metal is fed to the pair of flat portions. Thus, the second ceramic package is capable of achieving the same effects as the effects (1) to (4).

Here, each side portion of the second ceramic package indicates one of the sides of the metalizing layer having a rectangular frame shape when viewed in a plan.

The present invention also includes a first ceramic package in which the package body includes external connection terminals at or around four corner portions of the surface in which the cavity is not open. In other words, the cavity of the package body is not open in one of the top surface or the bottom surface of the package body, and external connection terminals are disposed at or around four corner portions of the one of the top surface or the bottom surface of the package body in which the cavity is not open.

In this configuration in which the external connection terminals made of, for example, W are disposed at or around four corner portions of the rectangular surface in which the cavity is not open, a recessed portion and a pair of flat portions on respective sides of the recessed portion are easily formed when the package body including the external connection terminals is manufactured. Specifically, in the step of laminating together multiple green sheets each having a rectangular frame shape or a flat board shape and crimping the green sheets, a recessed portion can be readily formed in a middle portion of each side portion of the surface surrounding the opening of the cavity of an unfired package body and a pair of flat portions can be concurrently readily formed on respective sides of the recessed portion.

Thus, the first ceramic package can be manufactured at low cost with a relatively small number of manufacturing steps.

The invention also includes a first ceramic package in which, in each side portion of the surface of the package body surrounding the opening of the cavity, the recessed portion has a bottom surface that is horizontal in a side view and the pair of flat portions are horizontal in a side view. In other words, each of the recessed portions has a bottom surface that is horizontal in a side view and each of the flat portions is horizontal in a side view.

This configuration allows a relatively large amount of brazing filler metal to be fed to a middle portion of each side portion of the surface of the package body, at which the recessed portion is located, and a relatively small amount of brazing filler metal to be fed to both end portions of each side portion, at which the pair of flat portions are located. Thus, this first ceramic package is capable of more reliably achieving the effects (1) to (4).

The invention also includes a second ceramic package in which the number of unit metalizing layers constituting the flat portions at each side portion of the metalizing layer is larger than the number of unit metalizing layers constituting the recessed portion at each side portion of the metalizing layer. In other words, a number of unit metalizing layers constitutes the recessed portion of each side portion of the metalizing layer and a larger number of unit metalizing layers constitutes the flat portions of each side portion of the metalizing layer.

Here, in the rectangular-frame-shaped metalizing layer disposed on the surface of the package body, the number of unit metalizing layers constituting the flat portions at each side portion of the metalizing layer is larger than the number of unit metalizing layers constituting the recessed portion at each side portion of the metalizing layer. Thus, a relatively large amount of brazing filler metal is fed to a middle portion of each side portion of the metalizing layer, at which the recessed portion is located, and a relatively small amount of brazing filler metal is fed to both end portions of each side portion, at which the recessed portion is not located. Thus, the second ceramic package having the above-described configuration is also capable of achieving the effects (1) to (4).

Here, the unit metalizing layer indicates a metalizing layer having a thickness within a range that can be formed through one screen-printing operation. Examples of the combination of the number of layers forming the recessed portion and the number of layers forming the flat portions include combinations of one layer and two layers, two layers and three layers, and three layers and four or five layers.

The invention also includes a second ceramic package in which upper surfaces of the flat portions of each side portion of the metalizing layer are located higher than a bottom surface of the recessed portion of the side portion of the metalizing layer.

In this metalizing layer, the upper surfaces of the flat portions at each side portion are located higher than the bottom surface of the recessed portion at the side portion. Thus, a relatively large amount of brazing filler metal is fed to a middle portion of each side portion of the metalizing layer, at which the recessed portion is located, and a relatively small amount of brazing filler metal is fed to both end portions of each side portion of the metalizing layer, at which the recessed portion is not located. Thus, the second ceramic package having this configuration is also capable of achieving the effects (1) to (4).

A third ceramic package according to the invention is a ceramic package that includes a package body made of a ceramic and including a pair of surfaces (i.e., a top surface and a bottom surface), each having a rectangular outline when viewed in a plan; a metalizing layer disposed along four sides of at least one of the surfaces (i.e., at least one of the top surface and the bottom surface) of the package body, the metalizing layer having a rectangular frame shape when viewed in a plan; and a metal frame joined to an upper surface of the metalizing layer with a brazing filler metal layer interposed therebetween, and the metal frame defining a cavity. The package body includes pairs of opposing side portions and each side portion of at least one of the pairs includes a recessed portion in a middle portion of the side portion and a pair of flat portions on respective sides of the recessed portion, or the metalizing layer includes pairs of opposing side portions and each side portion of at least one of the pairs includes a recessed portion in a middle portion of the side portion and a pair of flat portions on respective sides of the recessed portion. In other words, the package body includes pairs of opposing side portions and for at least one of the pairs of opposing side portions, each side portion of the pair includes a recessed portion in a middle portion of the side portion and a flat portion at each end of the recessed portion, or the metalizing layer includes pairs of opposing side portions and for at least one of the pairs of opposing side portions, each side portion of the pair includes a recessed portion in a middle portion of the side portion and a flat portion at each end of the recessed portion.

Here, in the third ceramic package, a flat package body having a pair of surfaces includes pairs of opposing side portions and each side portion of at least one of the pairs includes a recessed portion in a middle portion of the side portion and a pair of flat portions on respective sides of the recessed portion, or the metalizing layer includes pairs of opposing side portions and each side portion of at least one of the pairs includes a recessed portion in a middle portion of the side portion and a pair of flat portions on respective sides of the recessed portion. At each side portion of the metalizing layer, a relatively large amount of brazing filler metal is fed to a middle portion at which the recessed portion is located and a relatively small amount of brazing filler metal is fed to the pair of flat portions on respective sides of the recessed portion. Thus, the third ceramic package having the above-described configuration is also capable of achieving the effects (1) to (4).

Here, as in the above-described package body, in the configuration of a flat-board package body in which a cavity is not formed until joining the metal frame, both end portions of each side portion represent areas having a distance, from the end of the side portion, approximately equivalent to the thickness of a ceramic layer constituting the package body to twice the thickness of the ceramic layer. The area excluding these end portions is the middle portion.

A first electronic component device according to the invention is an electric component device including a package body made of a ceramic and including a pair of surfaces (i.e., a top surface and a bottom surface), each having a rectangular outline when viewed in a plan, and side surfaces disposed between four sides (edges) of one of the surfaces (the top surface) and four sides (edges) of the other surface (the bottom surface), the package body defining a cavity that has an opening in at least one of the surfaces (i.e., at least one of the top surface and the bottom surface) of the package body, the opening rectangular when viewed in a plan; a metalizing layer disposed over the at least one surface (i.e., the at least one of the top surface and the bottom surface) of the package body, the metalizing layer surrounding the opening of the cavity and having a rectangular frame shape when viewed in a plan; a metal frame joined to an upper surface of the metalizing layer with a brazing filler metal layer interposed therebetween; and a metal lid joined to an upper surface of the metal frame. The at least one surface of the package body surrounding the opening of the cavity includes pairs of opposing side portions and each side portion of at least one of the pairs includes a recessed portion in a middle portion of the side portion and a pair of flat portions on respective sides of the recessed portion. Alternatively, the metalizing layer includes pairs of opposing side portions and each side portion of at least one of the pairs includes a recessed portion in a middle portion of the side portion and a pair of flat portions on respective sides of the recessed portion. In other words, the at least one of the top surface and the bottom surface of the package body includes pairs of opposing side portions surrounding the opening of the cavity and for at least one of the pairs of opposing side portions, each side portion of the pair includes a recessed portion in a middle portion of the side portion and a flat portion at each end of the recessed portion, or the metalizing layer includes pairs of opposing side portions and for at least one of the pairs of opposing side portions, each side portion of the pair includes a recessed portion in a middle portion of the side portion and a flat portion at each end of the recessed portion.

A second electronic component device according to the invention is an electric component device including a package body made of a ceramic and including a pair of surfaces (i.e., a top surface and a bottom surface), each having a rectangular outline when viewed in a plan; a metalizing layer disposed along four sides of at least one of the surfaces (i.e., at least one of the top surface and the bottom surface) of the package body, the metalizing layer having a rectangular frame shape when viewed in a plan; a metal frame joined to an upper surface of the metalizing layer with a brazing filler metal layer interposed therebetween, and the metal frame defining a cavity inside thereof; and a metal lid joined to an upper surface of the metal frame. The at least one surface of the package body includes pairs of opposing side portions and each side portion of at least one of the pairs includes a recessed portion in a middle portion of the side portion and a pair of flat portions on respective sides of the recessed portion. Alternatively, the metalizing layer includes pairs of opposing side portions and each side portion of at least one of the pairs includes a recessed portion in a middle portion of the side portion and a pair of flat portions on respective sides of the recessed portion. In other words, the at least one of the top surface and the bottom surface of the package body includes pairs of opposing side portions surrounding the opening of the cavity and for at least one of the pairs of opposing side portions, each side portion of the pair includes a recessed portion in a middle portion of the side portion and a flat portion at each end of the recessed portion, or the metalizing layer includes pairs of opposing side portions and for at least one of the pairs of opposing side portions, each side portion of the pair includes a recessed portion in a middle portion of the side portion and a flat portion of each end of the recessed portion.

This configuration is capable of achieving the effects (1) to (3) when the metal lid is joined to the upper surface of the metal frame of the ceramic package by seam welding. This configuration is also capable of reliably achieving the effect (5), with which the performance of the electronic component installed in the cavity is reliably secured, with airtight joining of the metal lid.

The metal lid here is also made of alloy 42, Kovar, alloy 194, or a stainless steel, as in the above-described case.

A method for manufacturing the first electronic component device according to the invention is a method for manufacturing the first electronic component device, the method including a step of preparing the package body defining the cavity; a step of disposing the metalizing layer over the surface of the package body with the metalizing layer surrounding the opening of the cavity and having a rectangular frame shape when viewed in a plan; a step of joining the metal frame to the upper surface of the metalizing layer with the filler metal layer interposed therebetween; and a step of joining the metal lid to the upper surface of the metal frame. In the step of preparing the package body, in each side portion of at least one of pairs of opposing side portions of the at least one surface of the package body surrounding the opening of the cavity, a recessed portion is formed in the middle portion of the side portion and a pair of flat portions are formed on respective sides of the recessed portion. Alternatively, in the step of disposing the metalizing layer, in each side portion of at least one of pairs of opposing side portions of the metalizing layer, a recessed portion is formed in the middle portion of the side portion and a pair of flat portions are formed on respective sides of the recessed portion. In other words, in the step of preparing the package body, for at least one of the pairs of opposing side portions surrounding the opening of the cavity, the recessed portion is formed in the middle portion of each side portion of the pair and a flat portion is formed at each end of the recessed portion, or in the step of disposing the metalizing layer, for at least one of the pairs of opposing side portions of the metalizing layer, the recessed portion is formed in the middle portion of each side portion of the pair and a flat portion is formed at each end of the recessed portion.

A method for manufacturing the second electronic component device according to the invention includes a step of preparing the package body including a pair of surfaces (i.e., a top surface and a bottom surface); a step of disposing the metalizing layer along four sides of the at least one of the surfaces (i.e., the at least one of the top surface and the bottom surface) of the package body, the metalizing layer having a rectangular frame shape when viewed in a plan; a step of joining the metal frame to the upper surface of the metalizing layer with the brazing filler metal layer interposed therebetween; and a step of joining the metal lid to the upper surface of the metal frame. In the step of preparing the package body, in each side portion of at least one of pairs of opposing side portions of the at least one surface of the package body, a recessed portion is formed in the middle portion of the side portion and a pair of flat portions are formed on respective sides of the recessed portion. Alternatively, in the step of disposing the metalizing layer, in each side portion of at least one of pairs of opposing side portions of the metalizing layer, a recessed portion is formed in the middle portion of the side portion and a pair of flat portions are formed on respective sides of the recessed portion. In other words, in the step of preparing the package body, for at least one of the pairs of opposing side portions surrounding the opening of the cavity, the recessed portion is formed in the middle portion of each side portion of the pair and a flat portion is formed at each end of the recessed portion, or, in the step of disposing the metalizing layer, for at least one of the pairs of opposing side portions of the metalizing layer, the recessed portion is formed in the middle portion of each side portion of the pair and a flat portion is formed at each end of the recessed portion.

Here, the recessed portion located at the middle portion of each side portion of at least one pair of opposing side portions of the package body is formed by performing pressing or laser processing on a middle portion of each side portion of a green sheet, which is to serve as the package body.

This configuration is capable of reliably manufacturing an electronic component device capable of achieving the effects (1) to (3) and (5) (effect (6)).

The metalizing layer is formed by, for example, screen-printing an electrically conductive paste containing metal powder to the surface of the package body.

A portion of the surface of the package body corresponding to the bottom surface of the recessed portion of each side portion that is lower than the pair of flat portions of the side portion is formed by pressing a press having a predetermined shape against an uppermost green sheet of the package body. Alternatively, the portion of the surface of the package body corresponding to the bottom surface is formed by, for example, disposing unfired external connection terminals at or around four corner portions of the undersurface of a lowermost green sheet of the package body and then crimping the green sheet laminate in the thickness direction.

BRIEF DESCRIPTION OF THE DRAWINGS

Illustrative aspects of the invention will be described in detail with reference to the following figures wherein:

FIGS. 11A and 11B are side views of the second ceramic package when viewed from the sides perpendicular to each other;

FIGS. 12A and 12B schematically illustrate a second ceramic package having a different configuration and are side views of the second ceramic package viewed from different positions;

FIGS. 17A to 17E are schematic diagrams of steps for manufacturing the third ceramic package;

DETAILED DESCRIPTION OF EXEMPLARY EMBODIMENTS OF THE INVENTION

The following describes embodiments of the present invention.

Figure 1:
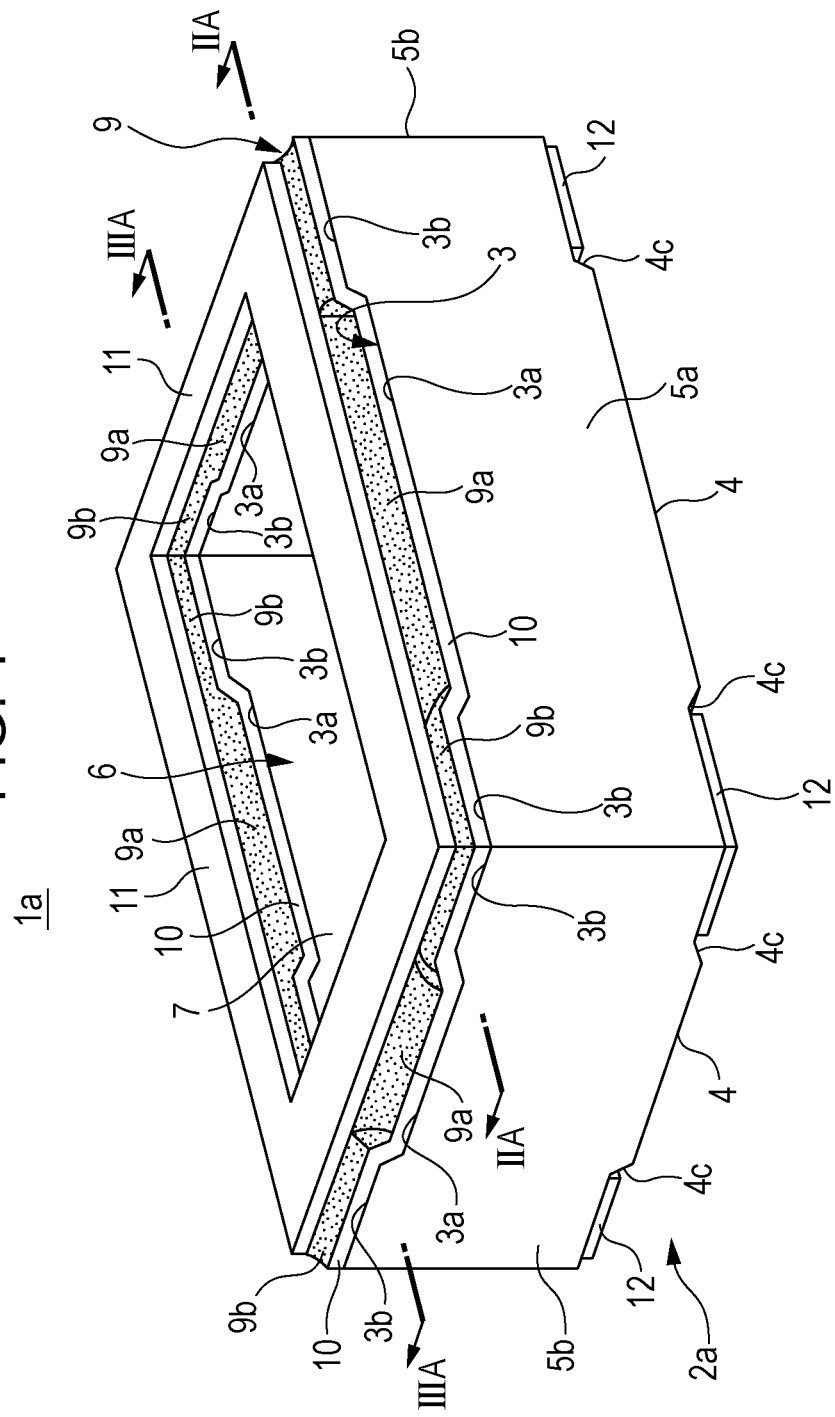
FIG. 1 is a perspective view of a first ceramic package according to the present invention.
Figure 2A:
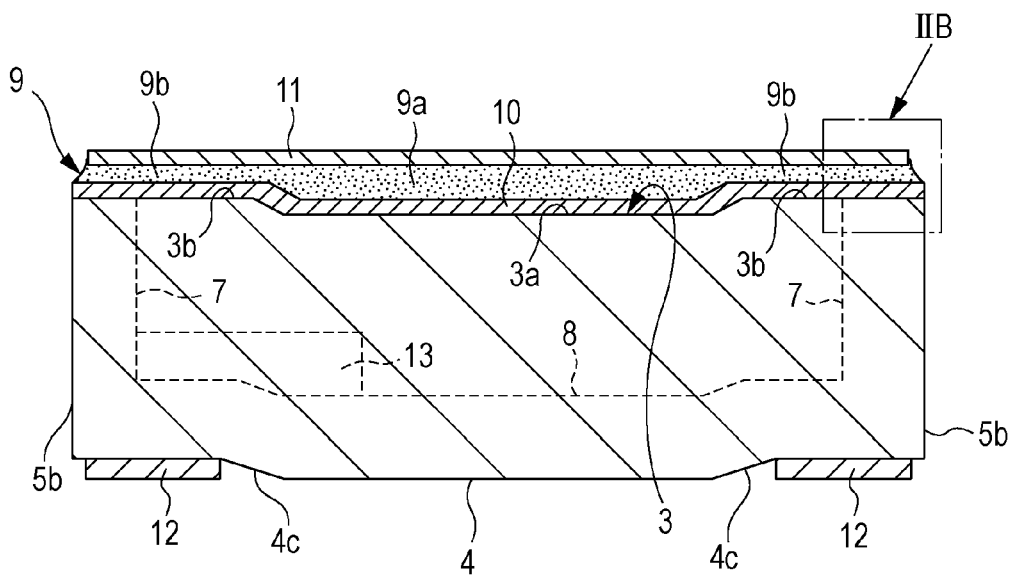
FIG. 2A is a vertical cross-sectional view taken along the line IIA-IIA in FIG. 1 and viewed in the direction of arrow in FIG. 1
Figure 3A:
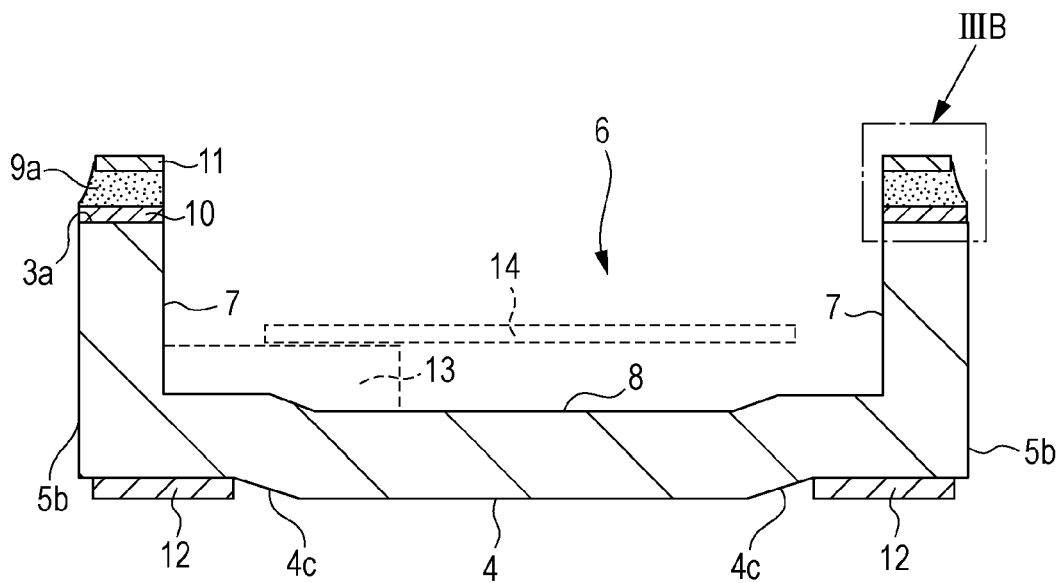
FIG. 3A is a vertical cross-sectional view taken along the line IIB-IIB in FIG. 1 and viewed in the direction of arrow in FIG. 1

FIG. 1 is a perspective view of an example of a first ceramic package 1a (or simply, a package, below) according to an embodiment, FIG. 2A is a vertical cross-sectional view taken along the line IIIA-IIIA in FIG. 1 and viewed in the direction of arrow in FIG. 1, and FIG. 3A is a vertical cross-sectional view taken along the line IIA-IIA in FIG. 1 and viewed in the direction of arrow in FIG. 1.

As illustrated in FIGS. 1, 2A, and 3A, the first package 1a includes a package body 2a having a rectangular parallelepiped shape (box shape) as a whole, a cavity 6 that is open in a surface 3 of the package body 2a, a metalizing layer 10 disposed along the entire periphery of the surface 3, which has a rectangular frame shape when viewed in a plan and surrounds the opening of the cavity 6, and a metal frame 11 having a rectangular frame shape when viewed in a plan and brazed (joined) to the upper surface of the metalizing layer 10 with a brazing filler metal layer 9 interposed therebetween.

The package body 2a is made of, for example, a high-temperature fired ceramic such as alumina. The package body 2a has a surface 3 and an undersurface 4 (surface 3), which have a rectangular outline when viewed in a plan, and side surfaces 5a on the long sides and side surfaces 5b on the short sides, which are located between four sides of the surface 3 and four sides of the undersurface 4.

The surface 3 of the package body 2a is formed of a pair of opposing long side portions and a pair of opposing short side portions that are perpendicular to the long side portions. A shallow recessed portion 3a that is open upward is formed at a middle portion of each side portion in the longitudinal direction. At both end portions of each side portion in the longitudinal direction that are on respective sides of the recessed portion 3a, a pair of horizontally flat portions 3b are located above a horizontal bottom surface of the recessed portion 3a. The bottom surface of the recessed portion 3a is located at the level lower by at least 5 μm than the pair of flat portions 3b of the corresponding side portion.

Over substantially the entirety of the surface 3 of the package body 2a having the side portions each having the recessed portion 3a at the middle portion and the pair of flat portions 3b on both end portions, the metalizing layer 10 made of, for example, tungsten (W) or molybdenum (Mo) and having a substantially uniform thickness is disposed so as to follow the shapes of the recessed portion 3a and the pair of flat portions 3b on each side portion.

At four corner portions on the undersurface 4 of the package body 2a at which external connection terminals 12 are disposed, recesses 4c are formed so as to cover the areas at which the external connection terminals 12 are disposed.

As illustrated in FIGS. 1, 2A, and 3A, a metal frame (metal ring) 11 made of Kovar and having a rectangular frame shape when viewed in a plan is joined to the upper surface of the metalizing layer 10 with the brazing filler metal layer 9 interposed therebetween. The brazing filler metal layer 9 is made of, for example, a Ag filler. Multiple drops of melt Ag filler are sequentially dropped at multiple positions over the upper surface of the metalizing layer 10. In the state where the Ag filler is spreading over the entirety of the upper surface of the metalizing layer 10, the metal frame 11 is placed on the upper surface and brazed (joined) thereto. At this time, in the brazing filler metal layer 9, a thick portion 9a containing a relatively large amount of Ag filler is formed at or around the portion immediately above the recessed portion 3a in the middle portion of each side portion of the surface 3 of the package body 2a, whereas a thin portion 9b containing a relatively small amount of Ag filler is formed at or around the portion immediately above the flat portions 3b on both end portions of each side portion.

Figure 2B:
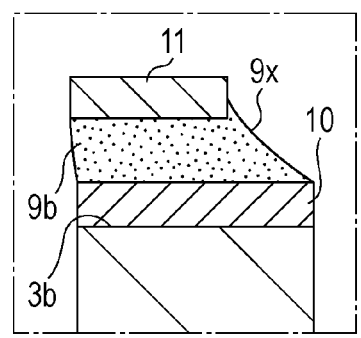
FIG. 2B is an expansion figure of the part surrounded by the dot-and-dash line IIB in FIG. 2A.
Figure 3B:
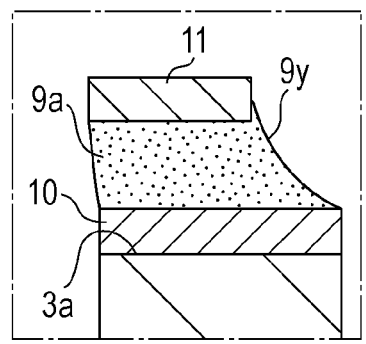
FIG. 3B is an expansion figure of the part surrounded by the dot-and-dash line IIIB in FIG. 3A.

As illustrated in FIG. 2B, portions of the brazing filler metal layer 9 at or around the portions immediately above the flat portions 3b at each side portion of the surface 3 are the thin portions 9b. Thus, fillets 9x, formed between the metalizing layer 10 and the metal frame 11 at the outer periphery of the thin portions 9b, are low and gently curved. On the other hand, as illustrated in FIG. 3B, a portion of the brazing filler metal layer 9 at or around the portion immediately above the recessed portion 3a at each side portion of the surface 3 is the thick portion 9a. Thus, a fillet 9y, formed between the metalizing layer 10 and the metal frame 11 at the outer periphery of the thick portion 9a is high and sharply curved.

If the surface 3 has a relatively small size, the recessed portion 3a formed at the middle portion of each side portion of the surface 3 of the package body 2a may be only formed at a pair of short side portions (surface 3), adjacent to the upper sides of a pair of short side surfaces 5b. Nevertheless, in the case where the outline of the surface 3 (undersurface 4) of the package body 2a is substantially square when viewed in a plan, it is recommended that the recessed portion 3a be formed at the middle portion of every side portion of the surface 3.

The cavity 6 has a bottom surface 8 having a rectangular shape when viewed in a plan, side surfaces 7 that stand erect from the four sides of the bottom surface 8 toward the surface 3, and a pair of stage portions 13 disposed on one of the short side surfaces 7 (left in FIG. 2). A mount terminal, not illustrated, for allowing an electronic component 14 such as a quartz oscillator to be mounted thereon is disposed on each stage portion 13.

Hereinbelow, a method for manufacturing the first package 1a and a first electronic component device 20a including the first package 1a is described.

A ceramic slurry is formed in advance so as to contain predetermined amounts of materials such as alumina powder, predetermined resin binder, and a solvent. The ceramic slurry is formed into a sheet by the doctor-blade method, so that four ceramic green sheets (simply referred to as green sheets, below) g1 to g4 are obtained. Among the four ceramic green sheets g1 to g4, the green sheets g2 to g4, which are to serve as upper layers, are subjected to a predetermined punching operation to have through holes that are to form the cavity 6. On the green sheet g4 that is to serve as an uppermost layer, an unfired metalizing layer 10 having a substantially uniform thickness is formed by screen-printing an electrically conductive paste, containing W powder or Mo powder, over substantially the entirety of the surface 3 having a rectangular frame shape when viewed in a plan. Thereafter, in the flat green sheet g1 that is to serve as a lowermost layer, multiple through holes having a small diameter are formed and each through hole is filled with the same electrically conductive paste through suction filling, so that multiple unfired via conductors, not illustrated, are formed. Also on the upper surfaces of a pair of protruding portions of the green sheet g2, which are to serve as the pair of stage portions 13 in the through hole, the same electrically conductive paste is screen-printed to form unfired mount terminals, not illustrated. In addition, the same electrically conductive paste is screen-printed to four corner portions of the surface of the green sheet g1, which is to serve as an undersurface 4, to form unfired external connection terminals 12 at the four corner portions.

Figure 4:
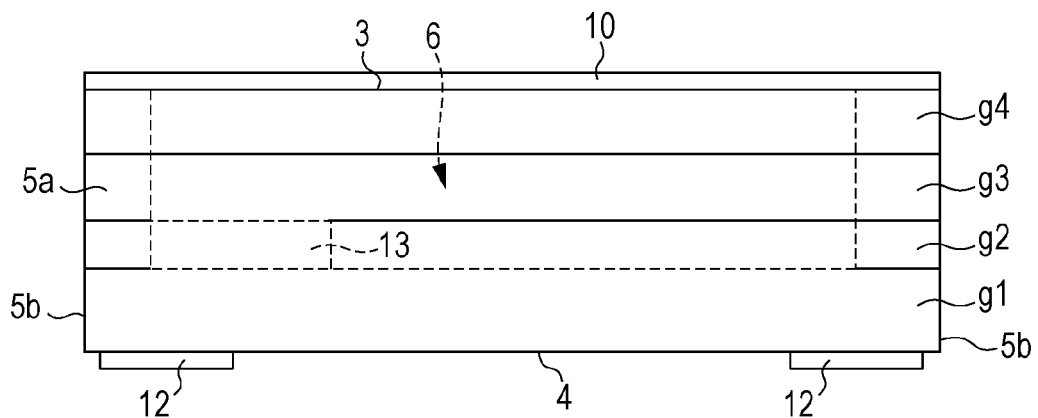
FIG. 4 is a schematic diagram of a step for manufacturing the ceramic package.

Subsequently, as illustrated in FIG. 4, the green sheets g1 to g4 are laminated together to form a green sheet laminate 2g having a cavity 6, which is open in the surface 3, and a pair of stage portions 13 at the bottom of the cavity 6. Subsequently, the green sheet laminate 2g is locked on a flat surface plate and pressed by a press having a flat lower surface (end surface) from above for crimping.

Figure 5:
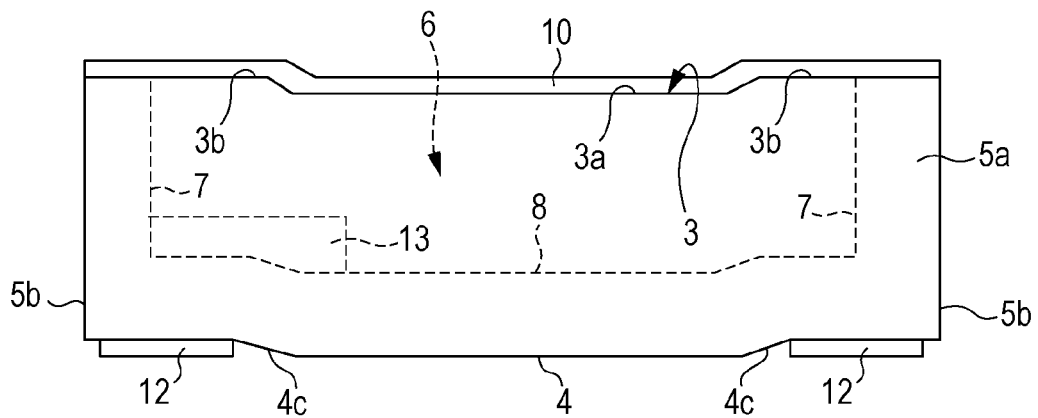
FIG. 5 is a schematic diagram of the step subsequent to the step illustrated in FIG. 4 for manufacturing the package.

As a result, as illustrated in FIG. 5, the green sheet laminate 2g subjected to crimping has recesses 4c at the four corner portions of the undersurface 4 near the external connection terminals 12. In addition, at each side portion of the surface 3 of the green sheet laminate 2g, a recessed portion 3a is formed in the middle portion and a pair of flat portions 3b are formed on both ends of the recessed portion 3a. Concurrently, the metalizing layer 10 disposed on the surface 3 is also deformed so as to follow the shapes of the recessed portion 3a and the pair of flat portions 3b on respective sides of the recessed portion 3a of each side portion. This effect is probably attributable to the fact that the external connection terminals 12 are harder than the green sheets g1 to g4.

In the case where the green sheet laminate 2g that includes the surface 3 having the recessed portion 3a and the pair of flat portions 3b on each side portion is formed, the crimping step may be performed by using a press having such a lower end surface that a protrusion is formed at the middle portion of every side of a rectangle, corresponding to the outline of the surface 3 when viewed in a plan.

Preferably, the recessed portion 3a and the pair of flat portions 3b on each side portion are continuous with one another with gentle slopes interposed therebetween without having sharpness at the boundaries therebetween in terms of a preventive against cracking of a fired package body 2. More preferably, the bottom surface of the recessed portion 3a is a gently curved surface.

In the green sheet laminate 2g in this state, the metalizing layer 10 and the surfaces of the external connection terminals 12 are sequentially coated with Ni and Au plating films.

Then, the green sheet laminate 2g is fired to obtain the package body 2a (a step for preparing a package body and a step for forming a metalizing layer).

Figure 6:
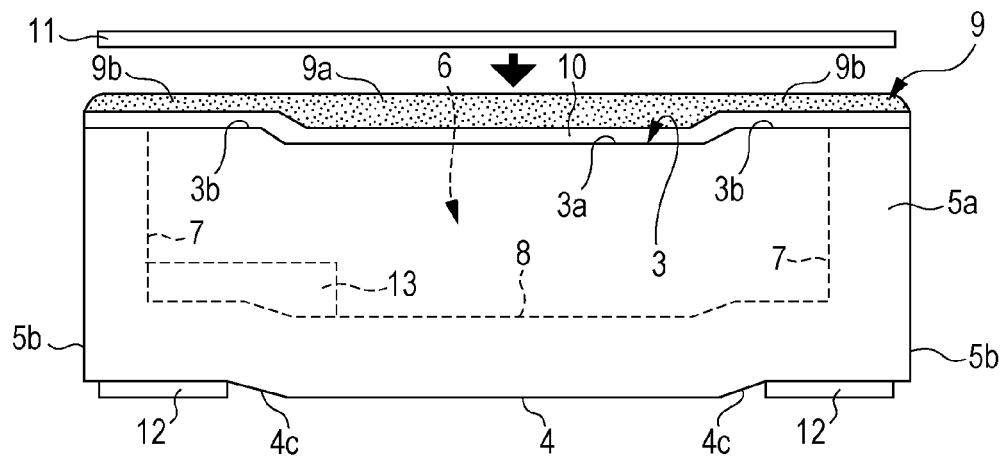
FIG. 6 is a schematic diagram of the step for manufacturing the package subsequent to the step illustrated in FIG. 5.

Subsequently, as illustrated in FIG. 6, a melt Ag filler is applied to the entirety of the upper surface of the metalizing layer 10 of the package body 2a so as to spread over the upper surface and then the brazing filler metal layer 9 in a melting state is placed on the upper surface. At this time, the brazing filler metal layer 9 has a thick portion 9a and a pair of thin portions 9b in accordance with the presence of the recessed portion 3a and the pair of flat portions 3b on the surface 3.

In this state, the metal frame 11 made of Kovar is placed in a horizontal position on the brazing filler metal layer 9. By solidification of the brazing filler metal layer 9, the metal frame 11 is brazed (joined) onto the upper surface of the metalizing layer 10 with the brazing filler metal layer 9 interposed therebetween (a step of joining a metal frame).

Figure 7:
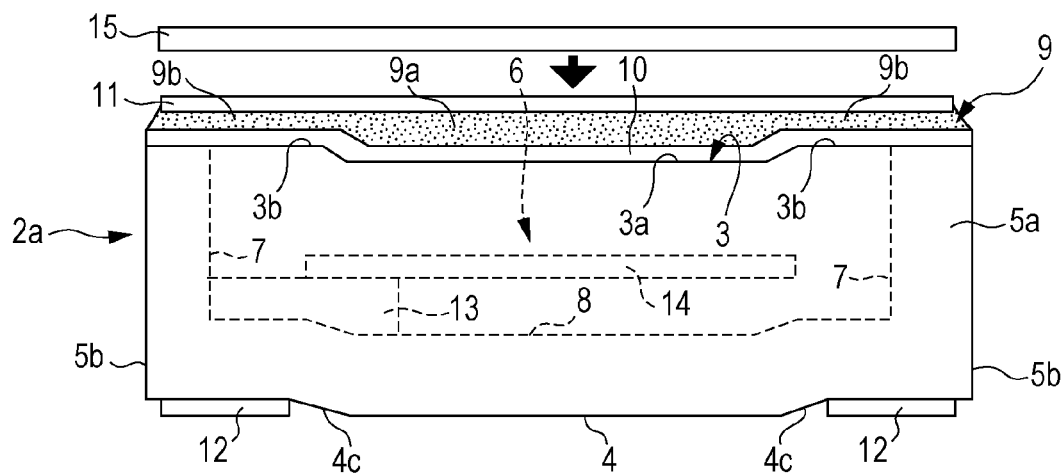
FIG. 7 is a schematic diagram of the step for manufacturing the package subsequent to the step illustrated in FIG. 6.

As a result, as illustrated in FIG. 7, the first package 1a including a package body 2a having the above-described cavity 6, the metalizing layer 10, the brazing filler metal layer 9, and the metal frame 11 was successfully obtained.

In addition, a step of manufacturing an electronic component device including the package 1a is performed.

As illustrated in FIG. 7, for example, an end portion of a quartz oscillator (electronic component) 14 is similarly brazed onto a mount terminal, not illustrated, formed on the upper surface of each of front and rear stage portions 13 disposed on the short side surface 7 of the bottom surface 8 of the cavity 6 of the package 1a. Then, the quartz oscillator 14 is horizontally mounted on each stage portion 13. In this state, a metal lid 15 made of Kovar and having a rectangular shape when viewed in a plan is placed on the upper surface of the metal frame 11, in the direction as illustrated with the arrow in FIG. 7, to seal the opening of the cavity 6.

Thereafter, seam welding is performed in such a manner that the interface at which the upper surface of the metal frame 11 and the vicinity of the undersurface of the metal lid 15 come into contact with each other is partially melted so that the metal frame 11 and the metal lid 15 are joined together (step for joining a metal lid).

Figures 8A, 8B:
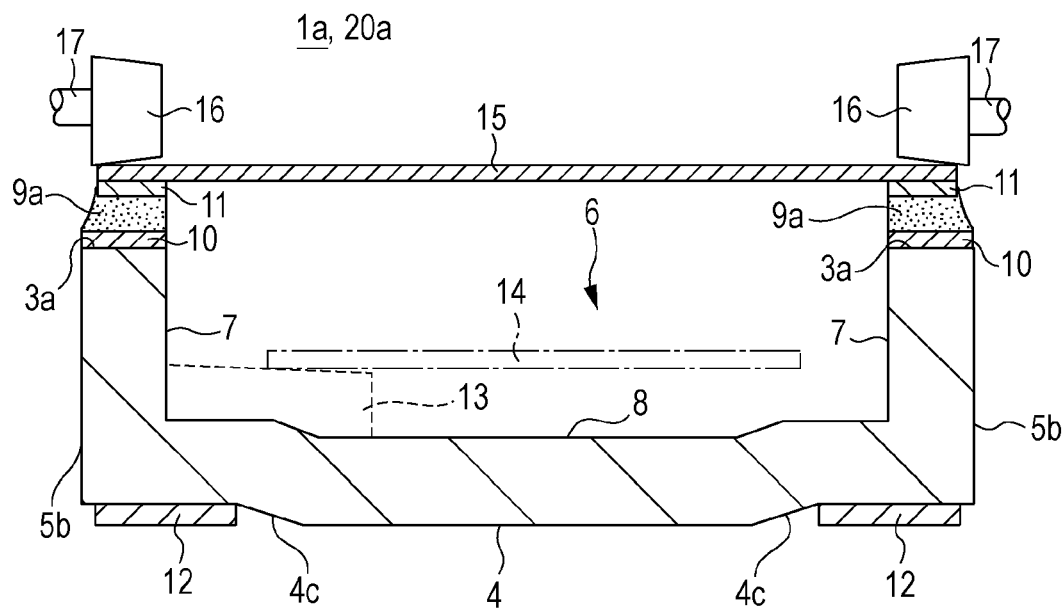
FIG. 8A is a vertical cross-sectional view of an electronic component device including the ceramic package and a method for manufacturing the electronic component device and FIG. 8B is a vertical cross-sectional view of a portion taken at a position different from that in FIG. 8A.

Firstly, as illustrated in FIGS. 8A and 8B, a pair of electrode rollers 16 fixed to respective end portions of a pair of rotation shafts 17 opposing in their axial direction are rolled while being individually fed with power or interchanging power therebetween throughout the length of the pair of short sides of the metal lid 15. Here, the rollers 16 are rolled along the pair of opposing short sides of the metal lid 15, the opposing short sides of the metal lid 15 being positioned above the short sides of the surface 3 of the package body 2a adjacent to the short side surfaces 5b.

At this time, heated portions at which the resistance to the current fed from the pair of electrode rollers 16 is highest are the vicinities of the middle portions of the opposing long sides of the metal lid 15, located above the long side surfaces 5a positioned in the front and rear in FIG. 8A. Concurrently, portions at which welding heat transmitted from the respective electrode rollers 16 meets and at which the temperature is highest are also the vicinities of the middle portions of the opposing long sides of the metal lid 15.

As described above, the thick portions 9a of the brazing filler metal layer 9 are positioned at or around portions immediately below the middle portions of the long sides of the metal lid 15. Thus, the thick portions 9a of the brazing filler metal layer 9 are capable of dispersing or absorbing the heat even when relatively high heat concentrates thereon in accordance with the electric resistance or relatively high welding heat concentrates thereon in accordance with the heat transmission. This configuration eliminates such trouble that part of the brazing filler metal layer 9 is remelted and airtightness of the cavity 6 is impaired. In addition, the contraction stress that occurs when the metal lid 15 contracts centripetally toward the center, when viewed in a plan, in accordance with solidification and cooling after seam welding is successfully absorbed or dispersed by the thick portions 9a of the brazing filler metal layer 9.

Figure 9A:
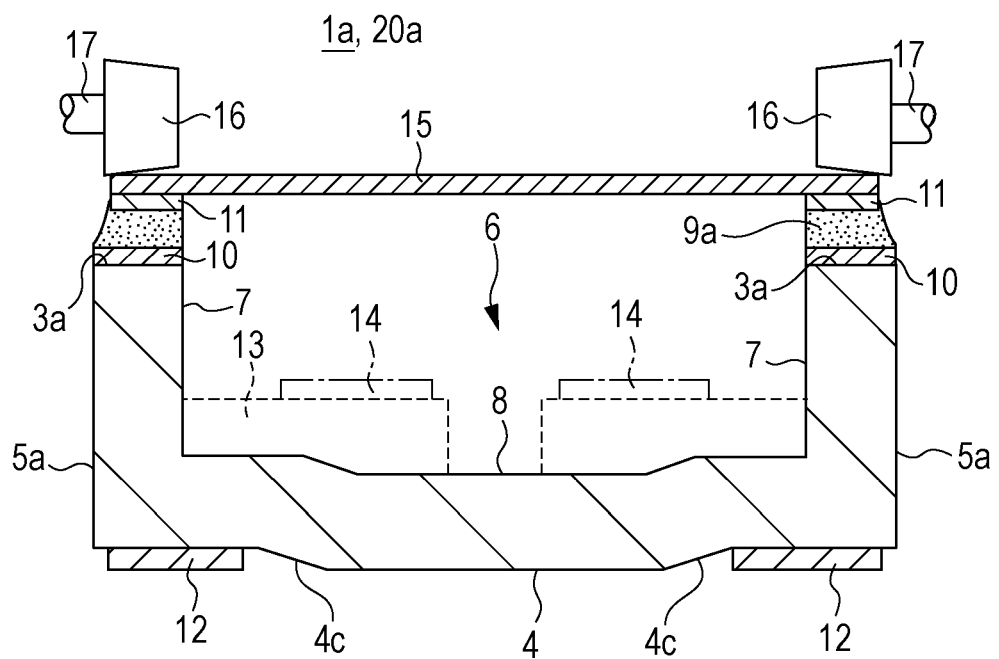
FIG. 9A is a vertical cross-sectional view of an electronic component device including the ceramic package and a method for manufacturing the electronic component device taken at a position different from that in FIG. 8A
Figure 9B:
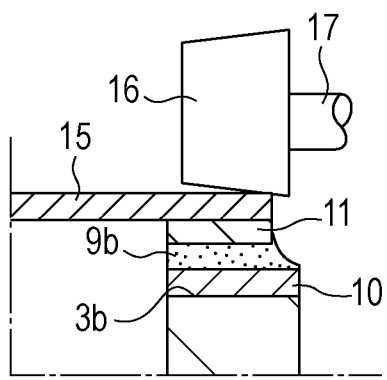
FIG. 9B is a vertical cross-sectional view of a portion taken at a position different from that in FIG. 9A.

Secondly, as illustrated in FIGS. 9A and 9B, the pair of electrode rollers 16 are rolled while being fed with power in the above-described manner throughout the length of the pair of long sides of the metal lid 15. Here, the rollers 16 are rolled along the pair of opposing long sides of the metal lid 15, the opposing long sides of the metal lid 15 being positioned above the long side portions of the surface 3 of the package body 2a, adjacent to the long side surfaces 5a.

At this time, portions at which the resistance to the current fed from the pair of electrode rollers 16 is highest are the vicinities of the middle portions of the opposing short sides of the metal lid 15, located above the short side surfaces 5b positioned in the front and rear in FIG. 9A. Concurrently, portions at which the welding heat transmitted from the respective electrode rollers 16 meets and at which the temperature is highest are also the vicinities of the middle portions of the opposing short sides of the metal lid 15. Also in this case, as described above, the thick portions 9a of the brazing filler metal layer 9 are positioned at or around portions immediately below the middle portions of the short sides of the metal lid 15. Thus, the thick portions 9a of the brazing filler metal layer 9 are capable of dispersing or absorbing the heat even when relatively high heat concentrates thereon in accordance with the electric resistance or relatively high welding heat concentrates thereon in accordance with the heat transmission. In addition, the contraction stress that occurs after the seam welding is successfully absorbed or dispersed by the thick portions 9a of the brazing filler metal layer 9. Thus, this configuration eliminates trouble of airtightness impairment, as in the above-described case.

In the case where the surface 3 of the package body 2 and the metal lid 15 are rectangular when viewed in a plan, the pair of short sides have a shorter distance from each electrode roller 16 to the middle portion than in the case of the pair of long sides. Thus, the middle portions of the short sides have a highest resistance to the current fed from the pair of electrode rollers 16. It is thus preferable that the thick portions 9a of the brazing filler metal layer 9 be formed at least at or around the portions immediately below the middle portions of the pair of short sides of the metal lid 15.

As illustrated in FIGS. 8 and 9, by the above-described steps, the first electronic component device 20a is successfully formed in which the quartz oscillators 14 are installed in the cavity 6 and the metal lid 15 is welded to the metal frame 11, forming an opening of the cavity 6, throughout the entire periphery of the metal frame 11.

It is readily understood that the above-described effects (1) to (4) are achieved by the first package 1a in which a recessed portion 3a is formed at the middle portion of each side portion of the surface 3 of the package body 2a so that a portion of the brazing filler metal layer 9 disposed over the recessed portion 3a is formed into the thick portion 9a.

In addition, with the above-described method for manufacturing the first package 1a, the package 1a is reliably manufactured.

Further, with the above-described method for manufacturing the first electronic component device 20a, the first electronic component device 20a is reliably manufactured.

The above-described method for manufacturing the first package 1a and the first electronic component device 20a also enables efficient manufacturing of multiple packages 1a or multiple electronic component devices 20a if each step is performed using a multiple-die set.

Figure 10:
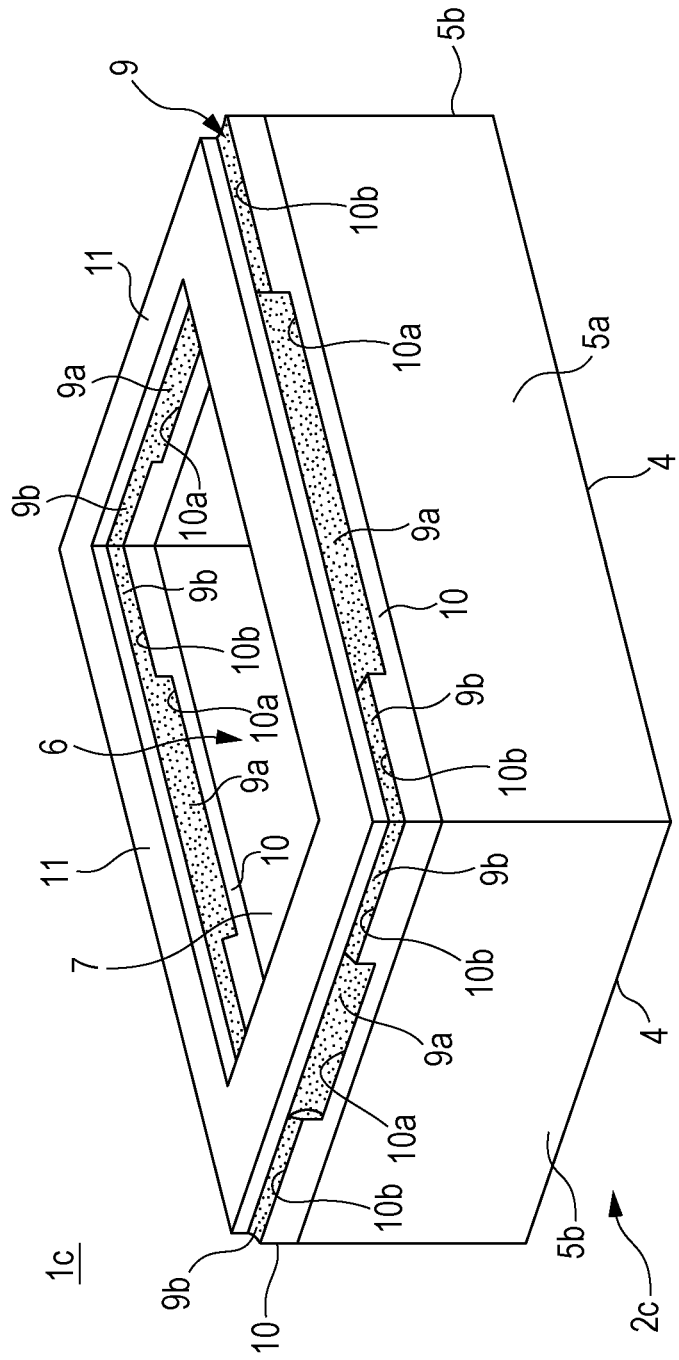
FIG. 10 is a perspective view of a second ceramic package according to the present invention.

FIG. 10 is a perspective view of a second package 1c according to an embodiment and FIGS. 11A and 11B are side views of the package 1c viewed in the directions perpendicular to each other.

As illustrated in FIGS. 10, 11A, and 11B, the second package 1c includes a package body 2c having a rectangular parallelepiped shape and a box shape as a whole, a similar cavity 6 that is open in a surface 3 of the package body 2c, a metalizing layer 10, which is disposed throughout the entire periphery of the surface 3 of the package body 2c, and a metal frame 11 brazed onto the metalizing layer 10 with a brazing filler metal layer 9 interposed therebetween.

The package body 2c is also made of alumina. The package body 2c has a flat surface 3 having a rectangular frame shape when viewed in a plan, a flat undersurface (surface) 4 having a rectangular shape when viewed from the bottom, a pair of opposing long side surfaces 5a, and a pair of short side surfaces 5b, which are located between the pair of opposing long side surfaces 5a.

In the metalizing layer 10, at least opposing short sides (side portions) each have a recessed portion 10a in the middle portion and a pair of flat portions 10b on respective sides of the recessed portion 10a. The metalizing layer 10 is obtained by laminating, at each side portion of the surface 3 of the package body 2c, a unit metalizing layer m1 extending throughout the length of the side portion and a unit metalizing layer m2 disposed only at both end portions of the side portion together into an integral unit.

Thus, a recessed portion 10a formed of only the unit metalizing layer m1 is located at the middle portion of each side portion of the surface 3 and horizontal flat portions 10b formed of the unit metalizing layers m1 and m2 are symmetrically located on both end portions of each side portion.

The unit metalizing layers m1 and m2 are formed in the following manner. The electrically conductive paste similar to the above-described paste is firstly screen-printed on substantially the entirety of the surface 3 of a green sheet having a rectangular frame shape when viewed in a plan, which is to serve as an uppermost layer of the green sheet laminate 2g, and secondly screen-printed on only four corner portions of the surface 3.

As illustrated in FIGS. 10, 11A, and 11B, in the above-described package 1c including the metalizing layer 10 that has the recessed portion 10a and the pair of flat portions 10b on respective sides of the recessed portion 10a at each side portion, a portion of the brazing filler metal layer 9 above the recessed portion 10a of the metalizing layer 10 in the middle portion of each side portion is formed into the thick portion 9e and portions of the brazing filler metal layer 9 above the flat portions 10b of the metalizing layer 10 on both end portions of each side portion are formed into the thin portions 9f.

Thus, the effects similar to those of the above-described embodiment and the above-described effects (1) to (4) are achieved also by the second package 1c in which the metal frame 11 is brazed onto the metalizing layer 10, including the recessed portion 10a in the middle portion and the flat portions 10b on both end portions of each side portion, with the brazing filler metal layer 9 interposed therebetween and the metal lid 15 is joined to the upper surface of the metal frame 11 by seam welding. The package 1c and a second electronic component device including the package 1c can be manufactured by a method similar to the above-described manufacturing method.

Thus, a second electronic component device (20c) including the package 1c is also capable of achieving the effect (5).

The number of unit metalizing layers mx for forming the recessed portion 10a and the number of unit metalizing layers my for forming the flat portions 10b may be appropriately changed as long as the number of unit metalizing layers my is larger than the number of unit metalizing layers mx.

FIGS. 12A and 12B are side views of a second package 1d according to another embodiment viewed in the directions perpendicular to each other.

As illustrated in FIGS. 12A and 12B, the second package 1d also includes a similar package body 2c, a similar cavity 6 that is open in a surface 3 of the package body 2c, a metalizing layer 10, which has a rectangular frame shape when viewed in a plan and which is disposed along the entire periphery of the surface 3 of the package body 2c, and a metal frame 11 brazed onto the metalizing layer 10 with a brazing filler metal layer 9 interposed therebetween.

The metalizing layer 10 forms, at each side portion, a continuous curve that has a recessed portion 10c at a middle portion in a side view, which is a lowest portion, and a pair of flat portions 10d gently curved and laterally symmetrically formed on respective sides of the recessed portion 10c, both end portions of the flat portions 10d being located at the highest positions.

As illustrated in FIGS. 12A and 12B, in the above-described second package 1d including the metalizing layer 10 that has the recessed portion 10c and the pair of flat portions 10d on respective sides of the recessed portion 10c at each side portion, a portion of the brazing filler metal layer 9 above the recessed portion 10c of the metalizing layer 10 in the middle portion of each side portion is formed into a thick portion 9g and portions of the brazing filler metal layer 9 above the flat portions 10d of the metalizing layer 10 on both end portions of each side portion are formed into the thin portions 9h.

Thus, the effects similar to those of the above-described embodiment and the above-described effects (1) to (4) are achieved also by the second package 1d in which the metal frame 11 is brazed onto the metalizing layer 10, including the recessed portion 10c in the middle portion and the flat portions 10d on both end portions of each side portion, with the brazing filler metal layer 9 interposed therebetween and the metal lid 15 is joined to the upper surface of the metal frame 11 by seam welding. The package 1d and an electronic component device including the package 1d can be manufactured by a method similar to the above-described manufacturing method.

Thus, a second electronic component device (20d) including the package 1d is also capable of achieving the effect (5).

Figure 13:
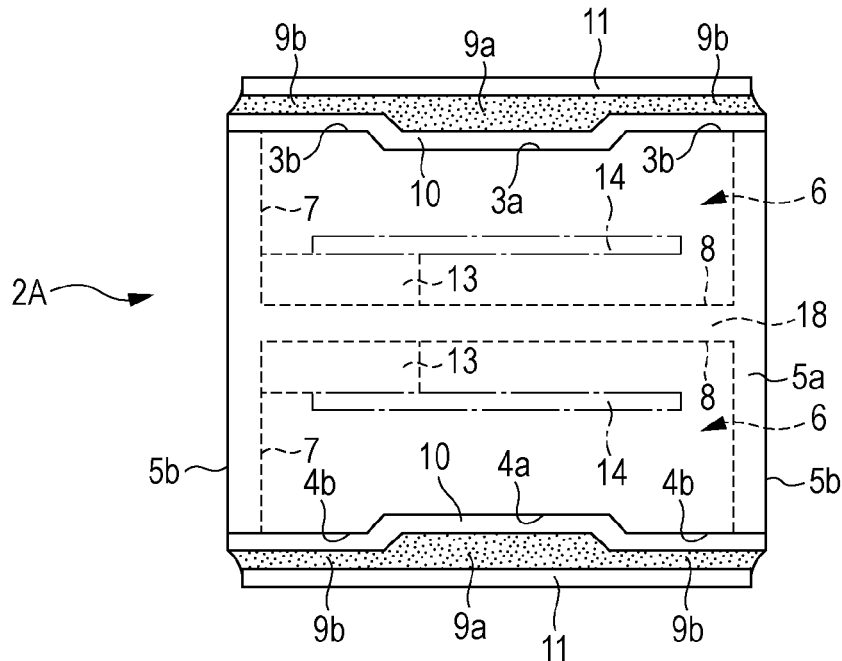
FIG. 13 schematically illustrates a first ceramic package having a different configuration and is a side view of the first ceramic package.

FIG. 13 is a side view of a first package 1A, which is an application form of the package 1a.

As illustrated in FIG. 13, the package 1A includes a package body 2A, having a pair of upper and lower cavities 6 respectively open in the surface 3 and the undersurface (surface) 4, a pair of upper and lower metalizing layers 10, respectively disposed along the entire peripheries of the surface 3 and the undersurface 4 of the package body 2A, a pair of upper and lower metal frames 11, respectively brazed to the upper side of the upper metalizing layer 10 and the lower side of the lower metalizing layer 10 with brazing filler metal layers 9 interposed therebetween, and a horizontal partitioning wall 18 interposed between the bottom surfaces 8 of the pair of upper and lower cavities 6.

As illustrated in FIG. 13, the package body 2A includes recessed portions 3a and 4a and pairs of flat portions 3b and 4b. The recessed portion 3a is formed in the middle portion of each side portion of the surface 3 having a rectangular frame shape when viewed in a plan. The recessed portion 4a is formed in the middle portion of each side portion of the undersurface 4 having a rectangular frame shape when viewed in a plan. The pair of flat portions 3b are formed on both end portions of the recessed portion 3a of each side portion. The pair of flat portions 4b are formed on both end portions of the recessed portion 4a of each side portion.

Thus, the thick portions 9a of the brazing filler metal layer 9 are positioned above the recessed portion 3a of each side portion of the surface 3 of the package body 2A and below the recessed portion 4a of each side portion of the undersurface 4 of the package body 2A. The thin portions 9b of the brazing filler metal layer 9 are positioned above the pair of flat portions 3b of each side portion of the surface 3 and below the pair of flat portions 4b of each side portion of the undersurface 4. The pair of upper and lower metal frames 11 are symmetrically brazed to the surface 3 and the undersurface 4 of the package body 2A with the thick portions 9a and the thin portions 9b interposed therebetween.

A similar pair of stage portions 13 are provided in each of the upper and lower cavities 6. Similar quartz oscillators 14 are allowed to be mounted to the upper side and lower side of each stage portion 13. Here, not only the same type of quartz oscillators 14, but also different electronic components may be installed in each cavity 6.

The above-described first package 1A is capable of achieving the effects (1) to (4) similar to those in the case of the first package 1a. In addition, the above-described first package 1A is capable of exerting multiple functions since it allows two electronic components to be mounted thereon while being separately sealed.

The package 1A and a first electronic component device including the package 1A can be manufactured by a manufacturing method obtained by slightly modifying the above-described manufacturing method.

Thus, an electronic component device (20A) including the package 1A is also capable of achieving an effect similar to the effect (5).

A package (1B) having the packages 1A disposed so as to be vertically symmetrical can be manufactured by a method obtained by modifying the above-described method.

Figure 14:
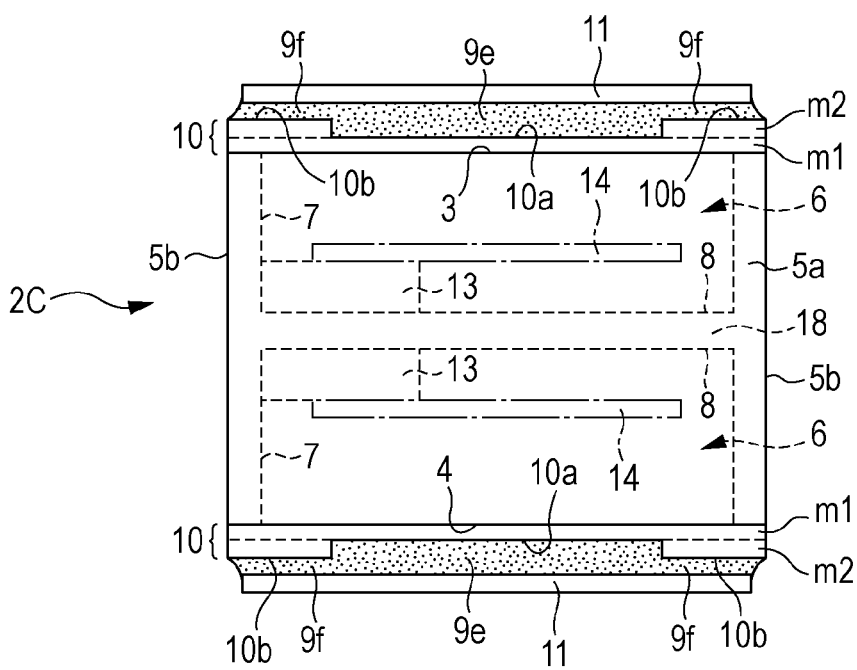
FIG. 14 schematically illustrates a second ceramic package having another configuration and is a side view of the second ceramic package.

FIG. 14 is a side view of a second package 1C, which is an application form of the second package 1c.

As illustrated in FIG. 14, the second package 1C includes a package body 2C, having a pair of upper and lower cavities 6 respectively open in the surface 3 and the undersurface (surface) 4, a pair of upper and lower metalizing layers 10, respectively disposed along the entire peripheries of the surface 3 and the undersurface 4 of the package body 2C, a pair of upper and lower metal frames 11, respectively brazed to the upper side of the upper metalizing layer 10 and the lower side of the lower metalizing layer 10 with brazing filler metal layers 9 interposed therebetween, and a horizontal partitioning wall 18 interposed between the bottom surfaces 8 of the pair of upper and lower cavities 6.

As illustrated in FIG. 14, each of the upper and lower metalizing layers 10 is formed by laminating, into an integrated body, a unit metalizing layer m1 disposed throughout the length of each side portion of the surface 3 or the undersurface 4 of the package body 2C and a unit metalizing layer m2 disposed at both end portions of each side portion.

Thus, a recessed portion 10a having a horizontal bottom surface in a side view and formed of only the unit metalizing layer m1 is located at the middle portion of each side portion of the metalizing layer 10 on the surface 3 or the undersurface 4. Flat portions 10b that are horizontal in a side view and formed of the unit metalizing layers m1 and m2 are symmetrically located on both end portions of each side portion.

As illustrated in FIG. 14, in the package 1C including the pair of upper and lower metalizing layers 10 each having the recessed portion 10a and the pair of flat portions 10b on respective sides of the recessed portion 10a on each side portion, a portion of the brazing filler metal layer 9 above or below the recessed portion 10a of the metalizing layer 10 in the middle portion of each side portion is formed into the thick portion 9e and portions of the brazing filler metal layer 9 above or below the flat portions 10b of the metalizing layer 10 on both end portions of each side portion are formed into the thin portions 9f.

Thus, the thick portion 9e of the brazing filler metal layer 9 is positioned above or below the recessed portion 10a of each side portion of each of the upper and lower metalizing layers 10. The thin portions 9f of the brazing filler metal layer 9 are positioned above or below the pair of flat portions 10b of each side portion of each of the upper and lower metalizing layers 10. The pair of upper and lower metal frames 11 are respectively brazed to the surface 3 and the undersurface 4 of the package body 2C with the thick portions 9e and the thin portions 9f interposed therebetween.

The second package 1C described above is capable of achieving the effects (1) to (4), which are similar to those in the case of the second package 1c and also capable of exerting multiple functions since it allows two electronic components to be mounted thereon while being separately sealed.

The package 1C and a second electronic component device including the package 1C can be manufactured by a manufacturing method obtained by slightly modifying the above-described manufacturing method.

Thus, the second electronic component device (20c) including the package 1C is also capable of achieving the effect (5).

A package 1D having the packages 1d disposed so as to be vertically symmetrical can be manufactured by a manufacturing method obtained by modifying the above-described manufacturing method.

Figure 15:
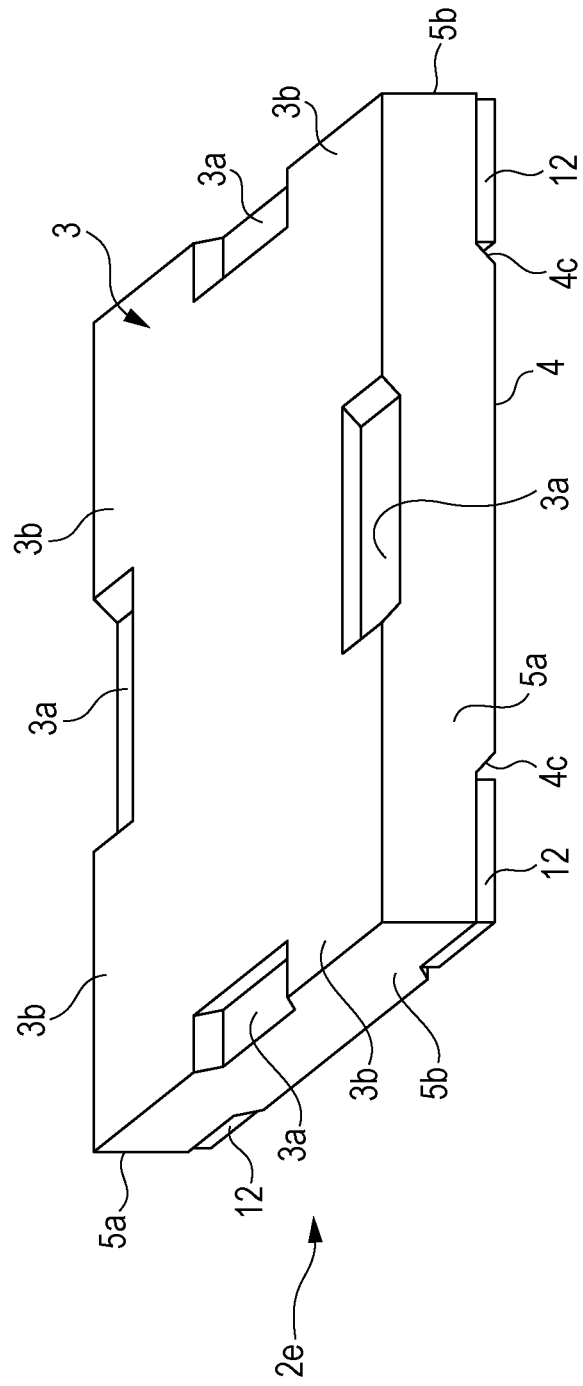
FIG. 15 is a perspective view of a package body according to an embodiment, included in a third ceramic package according to the present invention.

FIG. 15 is a perspective view of a package body 2e included in a third package 1e, described below. The package body 2e is similarly made of alumina. The package body 2e has a surface 3 and an undersurface (surface) 4, which are rectangular when viewed in a plan, and a pair of long side surfaces 5a and a pair of short side surfaces 5b disposed between the four sides of the surface 3 and the four sides of the undersurface 4. The package body 2e has a flat board shape as a whole.

In a middle portion of each side portion of the surface 3, a recessed portion 3a that has a trapezoidal shape with its shorter base on the bottom in a side view is formed. On both ends of the recessed portion 3a on each side portion, a pair of flat portions 3b are located. At or around four corner portions of the undersurface 4, recesses 4c that are rectangular in a bottom view are formed. External connection terminals 12, which are similar to those described above, are disposed in the recesses 4c.

As in the above-described case, the recessed portions 3a are formed by crimping a green sheet laminate having external connection terminals 12 on the lowermost surface. Alternatively, the recessed portions 3a are formed by performing pressing or laser processing on predetermined portions of green sheets that are to serve as the package body 2e, which is described later.

Figure 16A:
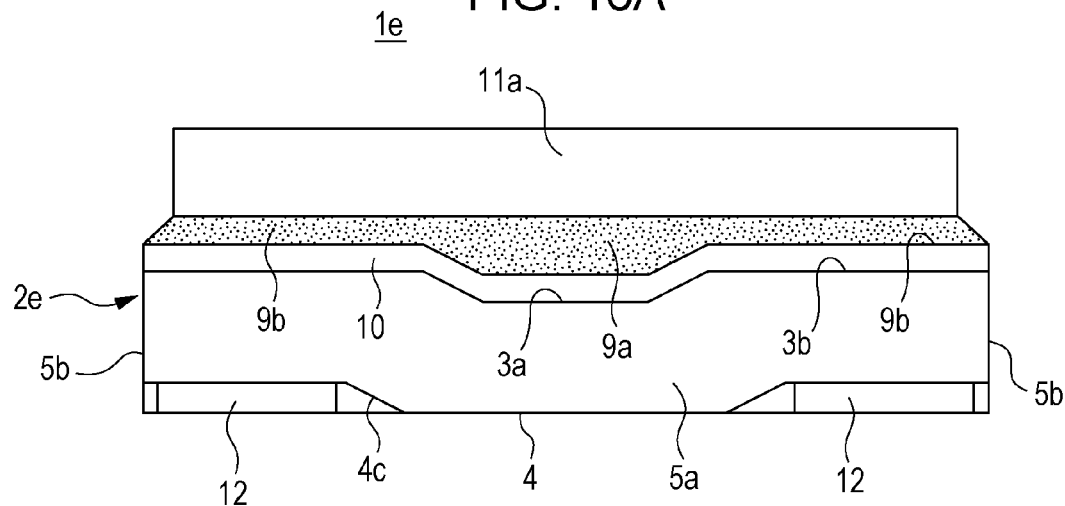
FIG. 16A is a side view of an example of a third ceramic package according to the invention and FIG. 16B is a vertical cross-sectional view of the third ceramic package.
Figure 16B:
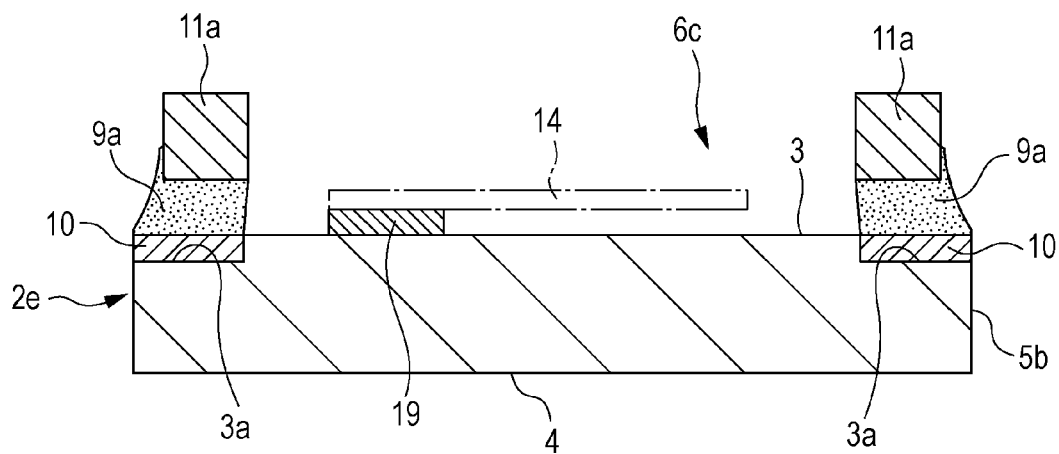

FIG. 16A is a side view of a third package 1e including the package body 2e and FIG. 16B is a vertical cross-sectional view of the vicinity of the middle portion of the third package 1e in the front-rear direction of FIG. 16A.

As illustrated in FIGS. 16A and 16B, the third package 1e includes a package body 2e, a metalizing layer 10 disposed along the four sides of the surface 3 of the package body 2e and having a rectangular frame shape when viewed in a plan, and a relatively thick metal frame 11a joined onto the metalizing layer 10 with brazing filler metal layers 9a and 9b interposed therebetween. Portions of the metalizing layer 10 above the respective recessed portions 3a of the package body 2e are recessed so as to follow the shapes of the recessed portions 3a. Thus, the brazing filler metal layer 9a that is relatively thick and contains a large amount of brazing filler metal is disposed over each recessed portion 3a. The brazing filler metal layer 9b that is relatively thin and contains a small amount of brazing filler metal is disposed over each of the flat portions 3b on both ends of the recessed portion 3a.

As illustrated in FIG. 16B, a cavity 6c is formed on the inner side of the metal frame 11a. The cavity 6c is surrounded by the metal frame 11a and uses the surface 3 of the package body 2e as its bottom surface. A pair of front and rear mount terminals 19 made of W or other materials are formed on the bottom surface of the cavity 6c. Quartz oscillators (electronic components) 14 are to be mounted on the mount terminals 19.

The above-described third package 1e is also capable of achieving the effects similar to the effects (1) to (4).

Instead of providing the recessed portions 3a to the package body 2e, each side portion of the surface 3 may be recessed so as to be curved throughout the length of the side portion, in the same manner as illustrated in FIG. 10.

A method for manufacturing the third package 1e is described referring to FIGS. 17A to 17E.

As illustrated in FIG. 17A, a green sheet g that is rectangular when viewed in a plan and manufactured in the same manner as above is prepared in advance. The green sheet g has a surface 3, an undersurface 4, and side surfaces 5a and 5b. As illustrated in FIG. 17B, middle portions of the respective side portions of the surface 3 of the green sheet g and four corner portions of the undersurface 4 of the green sheet g are subjected to pressing to form recessed portions 3a having a trapezoidal shape with its shorter base on the bottom in a side view, pairs of flat portions 3b on respective sides of the recessed portions 3a, and trapezoidal recesses 4c at or around the four corner portions of the undersurface 4.

Subsequently, as illustrated in FIG. 17C, an unfired metalizing layer 10 having a substantially uniform thickness and a rectangular frame shape when viewed in a plan is disposed along each side portion (each of four sides) of the surface 3 of the green sheet g by screen-printing. At this time, portions of the metalizing layer 10 disposed over the recessed portion 3a are recessed so as to follow the shapes of the recessed portions 3a. Besides, a pair of unfired mount terminals 19 are similarly disposed in a middle portion of the surface 3. In addition, unfired external connection terminals 12 are disposed in the respective recesses 4c.

Subsequently, the metalizing layer 10 and the green sheet g are fired to form a package body 2e. Then, the surfaces of the co-fired metalizing layer 10, the co-fired mount terminals 19, and the co-fired external connection terminals 12 are sequentially subjected to electrolytic Ni plating and electrolytic Au plating to be sequentially coated with a Ni plating film and a gold plating film.

Then, as illustrated in FIG. 17D, a melted brazing filler metal, which is similar to that described above, is fed to the upper surface of the metalizing layer 10 including the recessed portion 3a and the flat portions 3b and left to spread over the surface. Consequently, a brazing filler metal layer 9a that is relatively thick and contains a large amount of brazing filler metal is disposed above each recessed portion 3a and brazing filler metal layers 9b that are relatively thin and contain a small amount of brazing filler metal are disposed above the flat portions 3b on both sides of each recessed portion 3a.

Then, as illustrated in FIG. 17E, a metal frame 11a is placed on and joined to the brazing filler metal layers 9a and 9b in a horizontal position. Thus, the third package 1f is obtained.

By seam-welding the metal lid 15 to the upper surface of the metal frame 11a of the third package 1f in the same manner as described above, the same effects as the effects (1) to (4) are obtained. In addition, a third electronic component device (20e) including the third package 1f is capable of achieving an effect similar to the effect (5).

Figure 18A:
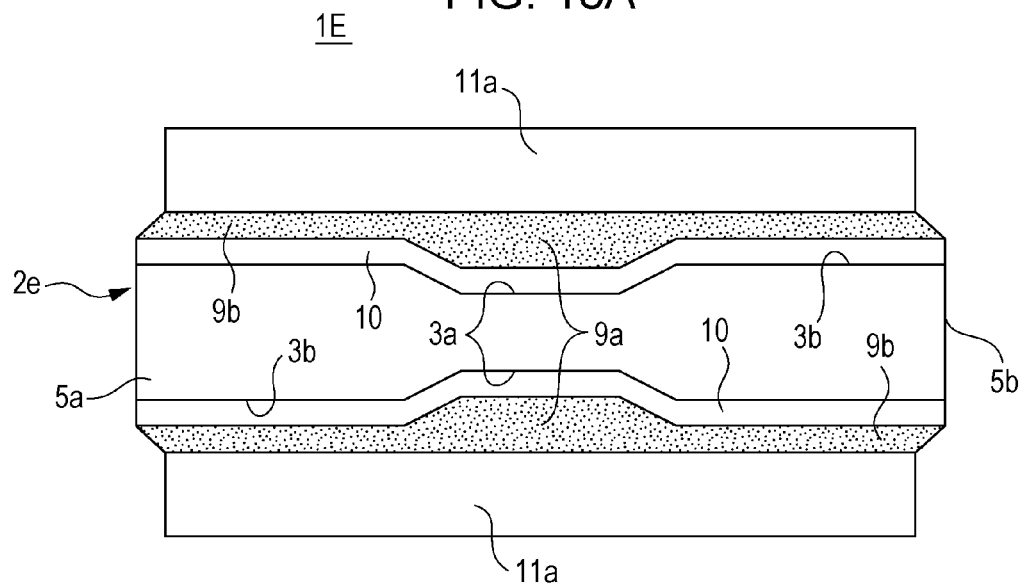
FIG. 18A is a side view of an application form of the third ceramic package and FIG. 18B is a vertical cross-sectional view of the application form.
Figure 18B:
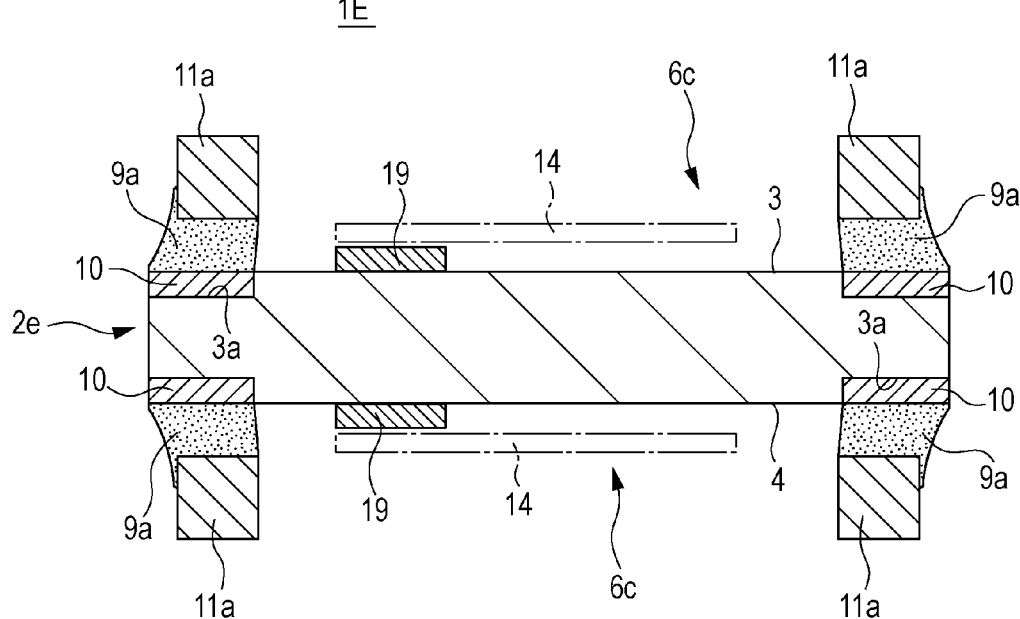

FIG. 18A is a side view of a package 1E, which is an application form of the package 1f, and FIG. 18B is a vertical cross-sectional view of the vicinity of the middle portion of the package 1E in the front-rear direction of FIG. 18A.

As illustrated in FIGS. 18A and 18B, the third package 1E includes the package body 2e, a pair of upper and lower metalizing layers 10 disposed along the four sides of the surface 3 of the package body 2e and the four sides of the undersurface 4 of the package body 2e and having a rectangular frame shape when viewed in a plan, and a pair of upper and lower metal frames 11a respectively joined to the upper side of the upper metalizing layer 10 and the lower side of the lower metalizing layer 10 with the brazing filler metal layers 9a and 9b interposed therebetween. Portions of the pair of upper and lower metalizing layers 10 immediately above and immediately below the recessed portions 3a of the package body 2e are recessed so as to follow the shapes of the recessed portions 3a.

The above-described third package 1E is capable of achieving the effects (1) to (4) as in the case of the third package 1f and also capable of exerting multiple functions since it allows two electronic components to be mounted thereon while being separately sealed.

The package 1E and a third electronic component device including the package 1E can be manufactured by a manufacturing method obtained by slightly modifying the above-described manufacturing method.

Thus, an electronic component device (20E) including the package 1E is also capable of achieving an effect similar to the effect (5).

Figure 19:
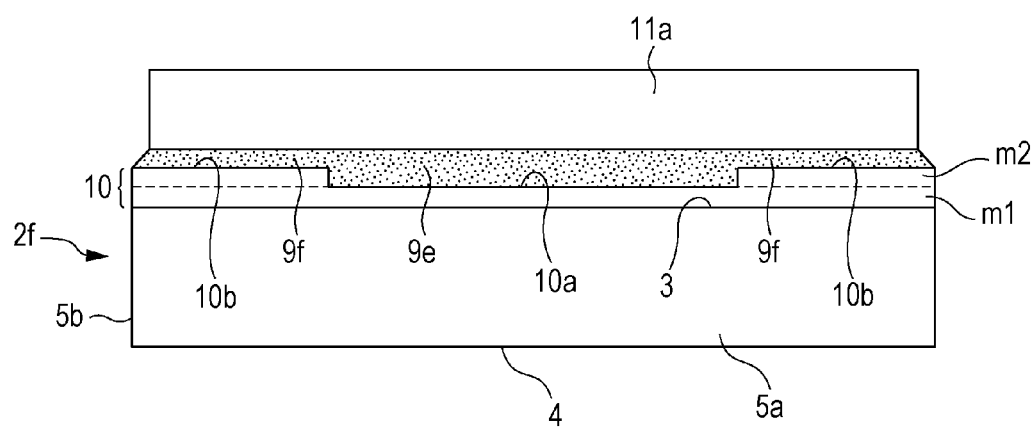
FIG. 19 is a side view of a third ceramic package having a different configuration.
Figure 20:
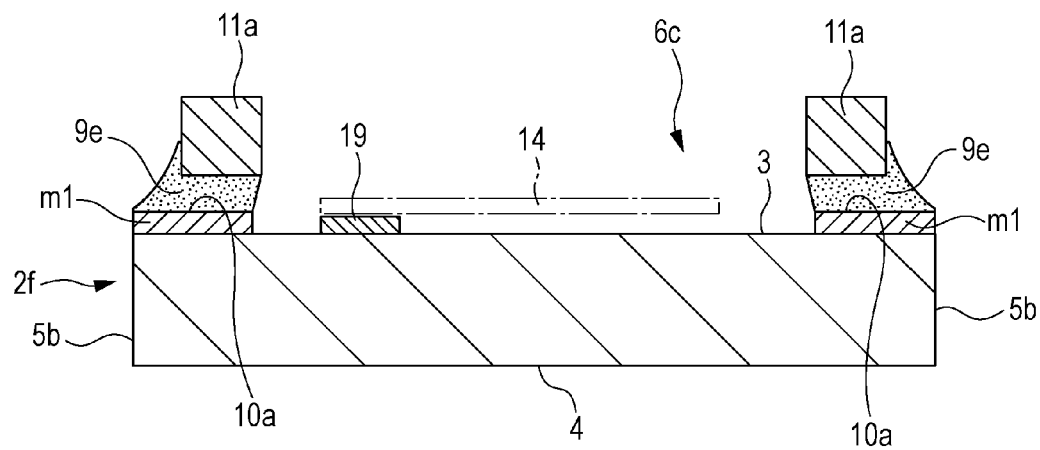
FIG. 20 is a vertical cross-sectional view of the third ceramic package.

FIG. 19 is a side view of a third package 1f of another embodiment and FIG. 20 is a vertical cross-sectional view of a middle portion of the third package 1f in the front-rear direction of FIG. 19.

As illustrated in FIGS. 19 and 20, the third package 1f includes a package body 2f having a flat surface 3, a flat undersurface 4, and four side surfaces 5a and 5b, as in the above-described case, a metalizing layer 10 formed on the surface 3 of the package body 2f, a metal frame 11a joined onto the metalizing layer 10 with brazing filler metal layers 9e and 9f interposed therebetween, and a cavity 6c disposed on the inner side of the metal frame 11a and having a bottom surface for which the surface 3 is used. On the bottom surface of the cavity 6c, a pair of front and rear mount terminals 19 are disposed in the same manner as described above.

The metalizing layer 10 is formed by integrally laminating a unit metalizing layer m1 and a unit metalizing layer m2 together into a single unit at each side portion (each of four sides) of the surface 3 of the package body 2f. The unit metalizing layer m1 is formed throughout the length of each side portion and the unit metalizing layer m2 is formed only at both end portions of each side portion.

Thus, a recessed portion 10a formed of only the unit metalizing layer m1 is located at the middle portion of each side portion of the surface 3 of the package body 2f and horizontal flat portions 10b formed of the unit metalizing layers m1 and m2 are symmetrically located on both end portions of each side portion. These unit metalizing layers m1 and m2 are formed in the same manner as described above.

Thus, the effects similar to those of the above-described embodiment and the above-described effects (1) to (4) are achieved also by the third package 1f in which the metal frame 11a is brazed onto the metalizing layer 10, including the recessed portion 10a in the middle portion and the flat portions 10b on both end portions of each side portion, with the brazing filler metal layers 9e and 9f interposed therebetween and the metal lid 15 is seam-welded to the upper surface of the metal frame 11a.

As illustrated in FIG. 12, the metalizing layer 10 may have a configuration in which a middle portion of each side portion of the surface 3 of the package body 2f may be recessed so as to be gently curved.

Figure 21:
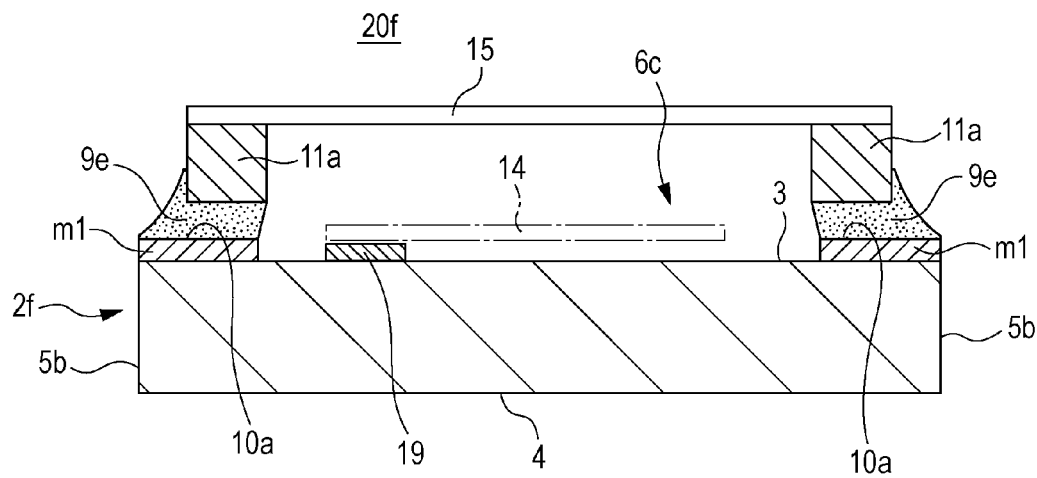
FIG. 21 is a vertical cross-sectional view of an application form of the third ceramic package.

FIG. 21 is a side view of a third electronic component device 20f including the package 1f. The electronic component device 20f is obtained by joining a metal lid 15 on the upper surface of the metal frame 11a of the package 1f by seam welding, as in the above-described case. In the seam welding, the above-described effects (1) to (4) as in the case of the package 1f are obtained.

The third package 1f and a third electronic component device 20f including the third package 1f can be manufactured by the same manufacturing method as the above-described manufacturing method.

Thus, the third electronic component device 20f including the package 1f is also capable of achieving the effect (5).

Figure 22:
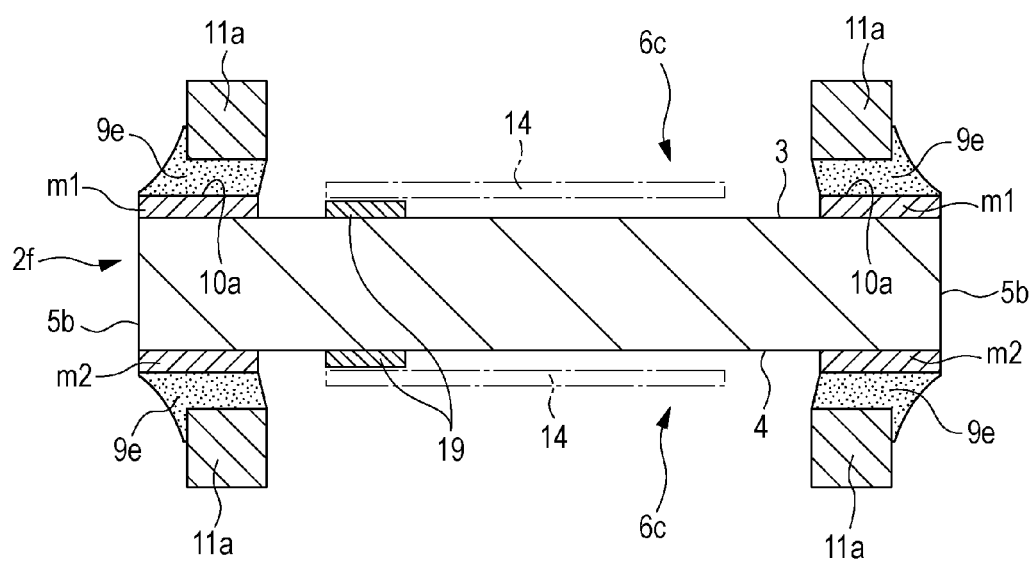
FIG. 22 is a vertical cross-sectional view of a second electronic component device including the ceramic package.

FIG. 22 is a vertical cross-sectional view of a third package 1F, which is an application form of the package 1f.

As illustrated, the package 1F includes a package body 2f, a pair of upper and lower metalizing layers 10 disposed along the four sides of a surface 3 of the package body 2f and the four sides of an undersurface 4 of the package body 2f and having a rectangular frame shape when viewed in a plan, and a pair of upper and lower metal frames 11a respectively joined to an upper side of the upper metalizing layer 10 and a lower side of the lower metalizing layer 10 with brazing filler metal layers 9e and 9f interposed therebetween. Portions of the pair of upper and lower metalizing layers 10 above and below the recessed portions 10a of the metalizing layers 10 are recessed so as to follow the shapes of the recessed portions 3a.

The above-described third package 1F is capable of achieving the effects (1) to (4) as in the case of the third package 1f and also capable of exerting multiple functions since it allows two electronic components to be mounted thereon while being separately sealed.

The package 1F and a third electronic component device 20f including the package 1F can be manufactured by a manufacturing method obtained by slightly modifying the above-described manufacturing method.

Thus, an electronic component device (20F) including the package 1F is also capable of achieving an effect similar to the effect (5).

The present invention is not limited to the embodiments described above.

For example, a ceramic constituting the package body of each embodiment is not limited to alumina. The ceramic may be a high-temperature fired ceramic, such as mullite or aluminum nitride, or a glass-ceramic, which is one type of low-temperature fired ceramics. In the case where the low-temperature fired ceramic is used among these ceramics, Ag or Cu is used for the metalizing layer or other conductive portions.

The recessed portion 3a formed in the middle portion of each side portion of the surface 3 of the package body 2a of the package 1a may be formed into a stepped shape having two or more steps in a side view. Such a stepped shape includes a laterally symmetrical shape and a laterally asymmetrical shape.

In addition, the recessed portion 10a formed in the middle portion of each side portion of the metalizing layer 10 of the package 1c may be formed into a stepped shape having two or more steps in a side view. Such a stepped shape also includes a laterally symmetrical shape and a laterally asymmetrical shape.

The recessed portions and the pair of flat portions on the surface 3 of the package body 2a of the package 1a include the following forms. In one example form, each side portion of the surface 3 having a rectangular frame shape when viewed in a plan includes a recessed portion, located in the middle portion and at the lowest in a side view, and a pair of flat portions, which are gently curved and laterally symmetrical with respect to the recessed portion and have their ends located at the highest, and the entirety of each side portion forms a continuous curve. In such a form, each side portion of the undersurface 4 of the package body 2a also forms a continuous curve in which the middle portion is located at the lowest and both end portions are located at the highest in a side view.

Further, the recessed portion in the middle portion of each side portion of the surface of the package body of the package may have a radius smaller than the radius of the curved surface forming each of the flat portions on both end portions of the recessed portion. The lowest portion of the recessed portion may be located lower than the lowest portion of the curved surface.

In addition, the recessed portion in the middle portion of each side portion of the metalizing layer of the package may also have a radius smaller than the radius of the curved surface forming each of the flat portions on both end portions of the recessed portion. The lowest portion of the recessed portion may also be located lower than the lowest portion of the curved surface.

The metalizing layer 10 of the package 1c may be formed in the following manner. An electrically conductive paste, which is similar to the one described above, is screen-printed multiple times on substantially the entirety of the surface 3 of a green sheet having a rectangular frame shape when viewed in a plan, which is to serve as the uppermost layer of a green sheet laminate 2g. Then, a laser beam is applied to only portions that are to serve as the recessed portions 10*a*, so that the metalizing layer 10 is formed.

In addition, the recessed portion 3*a* and the flat portions 3*b* may be also formed at such positions on the surface 3 of the package body 2*c* as to correspond to the recessed portion 10*a* and the flat portions 10*b* of the metalizing layer 10 of the package 1*c*.

Electronic components installed in the cavity may be surface acoustic wave (SAW) filters, semiconductor devices, piezoelectric elements, or other devices.

In addition, the package according to each of the above-described embodiments may be formed by using a multiple-die set so as to have, when viewed in a plan, an area vertically and laterally adjoining multiple packages together and an edge portion surrounding the area.

The present invention enables reliable provision of the following ceramic package, an electronic component device including the package, and a method for manufacturing the electronic component device. The ceramic package has highly reliable airtightness such that, when an opening of a cavity open to at least one of two surfaces of a box-shaped or plate-shaped package body is to be sealed, a rectangular metal lid plate or a brazing filler metal is not partially melted by heat transmitted from the pair of roller electrodes or electric resistance heat even when the metal lid plate is seam-welded to the upper surface of a metalizing layer, disposed on a surface that surrounds the opening and that is rectangular when viewed in a plan.

What is claimed is:

1. A ceramic package comprising:
   a package body made of a ceramic and including a top surface and a bottom surface, each having a rectangular outline when viewed in a plan, and side surfaces disposed between four edges of the top surface and four edges of the bottom surface, the package body defining a cavity that has an opening in at least one of the top surface and the bottom surface of the package body, the opening rectangular when viewed in a plan;
   a metalizing layer disposed over the at least one of the top surface and the bottom surface of the package body, the metalizing layer surrounding the opening of the cavity and having a rectangular frame shape when viewed in a plan; and
   a metal frame joined to an upper surface of the metalizing layer with a brazing filler metal layer interposed therebetween,
   wherein the at least one of the top surface and the bottom surface of the package body includes pairs of opposing side portions surrounding the opening of the cavity and for at least one of the pairs of opposing side portions, each side portion of the pair includes a recessed portion in a middle portion of the side portion and a flat portion at each end of the recessed portion.

2. The ceramic package according to claim 1, wherein the cavity is not open in one of the top surface or the bottom surface of the package body, and external connection terminals are disposed at or around four corner portions of the one of the top surface or the bottom surface of the package body in which the cavity is not open.

3. The ceramic package according to claim 1, wherein each of the recessed portions has a bottom surface that is horizontal in a side view and each of the flat portions is horizontal in a side view.

4. A ceramic package comprising:
   a package body made of a ceramic and including a top surface and a bottom surface, each having a rectangular outline when viewed in a plan, and side surfaces disposed between four edges of the top surface and four edges of the bottom surface, the package body defining a cavity that has an opening in at least one of the top surface and the bottom surface of the package body, the opening rectangular when viewed in a plan;
   a metalizing layer disposed over the at least one of the top surface and the bottom surface of the package body, the metalizing layer surrounding the opening of the cavity and having a rectangular frame shape when viewed in a plan; and
   a metal frame joined to an upper surface of the metalizing layer with a brazing filler metal layer interposed therebetween,
   wherein the metalizing layer includes pairs of opposing side portions and for at least one of the pairs of opposing side portions, each side portion of the pair includes a recessed portion in a middle portion of the side portion and a flat portion at each end of the recessed portion.

5. The ceramic package according to claim 4, wherein a number of unit metalizing layers constitutes the recessed portion of each side portion of the metalizing layer and a larger number of unit metalizing layers constitutes the flat portions of each side portion of the metalizing layer.

6. The ceramic package according to claim 4, wherein upper surfaces of the flat portions of each side portion of the metalizing layer are located higher than a bottom surface of the recessed portion of the side portion of the metalizing layer.

7. A ceramic package comprising:
   a package body made of a ceramic and including a top surface and a bottom surface, each having a rectangular outline when viewed in a plan;
   a metalizing layer disposed along four sides of at least one of the top surface and the bottom surface of the package body, the metalizing layer having a rectangular frame shape when viewed in a plan; and
   a metal frame joined to an upper surface of the metalizing layer with a brazing filler metal layer interposed therebetween, and the metal frame defining a cavity,
   wherein the package body includes pairs of opposing side portions and for at least one of the pairs of opposing side portions, each side portion of the pair includes a recessed portion in a middle portion of the side portion and a flat portion at each end of the recessed portion, or
   wherein the metalizing layer includes pairs of opposing side portions and for at least one of the pairs of opposing side portions, each side portion of the pair includes a recessed portion in a middle portion of the side portion and a flat portion at each end of the recessed portion.

8. An electric component device comprising:
   a package body made of a ceramic and including a top surface and a bottom surface, each having a rectangular outline when viewed in a plan, and side surfaces disposed between four edges of the top surface and four edges of the bottom surface, the package body defining a cavity that has an opening in at least one of the top surface and the bottom surface of the package body, the opening rectangular when viewed in a plan;
   a metalizing layer disposed over the at least one of the top surface and the bottom surface of the package body, the metalizing layer surrounding the opening of the cavity and having a rectangular frame shape when viewed in a plan;

a metal frame joined to an upper surface of the metalizing layer with a brazing filler metal layer interposed therebetween; and a metal lid joined to an upper surface of the metal frame, wherein the at least one of the top surface and the bottom surface of the package body includes pairs of opposing side portions surrounding the opening of the cavity and for at least one of the pairs of opposing side portions, each side portion of the pair includes a recessed portion in a middle portion of the side portion and a flat portion at each end of the recessed portion, or wherein the metalizing layer includes pairs of opposing side portions and for at least one of the pairs of opposing side portions, each side portion of the pair includes a recessed portion in a middle portion of the side portion and a flat portion at each end of the recessed portion.

9. A method for manufacturing the electronic component device according to claim 8, the method comprising:

a step of preparing the package body defining the cavity;

a step of disposing the metalizing layer over the at least one of the top surface and the bottom surface of the package body with the metalizing layer surrounding the opening of the cavity and having a rectangular frame shape when viewed in a plan;

a step of joining the metal frame to the upper surface of the metalizing layer with the brazing filler metal layer interposed therebetween; and a step of joining the metal lid to the upper surface of the metal frame, wherein, in the step of preparing the package body, for at least one of the pairs of opposing side portions surrounding the opening of the cavity, the recessed portion is formed in the middle portion of each side portion of the pair and a flat portion is formed at each end of the recessed portion, or wherein, in the step of disposing the metalizing layer, for at least one of the pairs of opposing side portions of the metalizing layer, the recessed portion is formed in the middle portion of each side portion of the pair and a flat portion is formed at each end of the recessed portion.

10. An electric component device comprising:

a package body made of a ceramic and including a top surface and a bottom surface, each having a rectangular outline when viewed in a plan;

a metalizing layer disposed along four sides of at least one of the top surface and the bottom surface of the package body, the metalizing layer having a rectangular frame shape when viewed in a plan;

a metal frame joined to an upper surface of the metalizing layer with a brazing filler metal layer interposed therebetween, and the metal frame defining a cavity; and a metal lid joined to an upper surface of the metal frame, wherein the at least one of the top surface and the bottom surface of the package body includes pairs of opposing side portions surrounding the opening of the cavity and for at least one of the pairs of opposing side portions, each side portion of the pair includes a recessed portion in a middle portion of the side portion and a flat portion at each end of the recessed portion, or wherein the metalizing layer includes pairs of opposing side portions and for at least one of the pairs of opposing side portions, each side portion of the pair includes a recessed portion in a middle portion of the side portion and a flat portion of each end of the recessed portion.

11. A method for manufacturing the electronic component device according to claim 10, the method comprising:

a step of preparing the package body including the top surface and the bottom surface;

a step of disposing the metalizing layer along the four sides of the at least one of the top surface and the bottom surface of the package body, the metalizing layer having a rectangular frame shape when viewed in a plan;

a step of joining the metal frame to the upper surface of the metalizing layer with the brazing filler metal layer interposed therebetween; and a step of joining the metal lid to the upper surface of the metal frame, wherein, in the step of preparing the package body, for at least one of the pairs of opposing side portions surrounding the opening of the cavity, the recessed portion is formed in the middle portion of each side portion of the pair and a flat portion is formed at each end of the recessed portion, or wherein, in the step of disposing the metalizing layer, for at least one of the pairs of opposing side portions of the metalizing layer, the recessed portion is formed in the middle portion of each side portion of the pair and a flat portion is formed at each end of the recessed portion.

* * * * *